United States Patent
Takaku

(10) Patent No.: US 9,685,412 B2
(45) Date of Patent: Jun. 20, 2017

(54) SEMICONDUCTOR APPARATUS AND MANUFACTURING METHOD FOR SAME

(71) Applicant: KABUSHIKI KAISHA TOSHIBA, Minato-ku (JP)

(72) Inventor: Satoru Takaku, Yokohama (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/916,470

(22) PCT Filed: Sep. 4, 2013

(86) PCT No.: PCT/JP2013/073752
§ 371 (c)(1),
(2) Date: Mar. 3, 2016

(87) PCT Pub. No.: WO2015/033395
PCT Pub. Date: Mar. 12, 2015

(65) Prior Publication Data
US 2016/0204072 A1    Jul. 14, 2016

(51) Int. Cl.
*H01L 21/48*       (2006.01)
*H01L 23/552*      (2006.01)
(Continued)

(52) U.S. Cl.
CPC ........ *H01L 23/552* (2013.01); *H01L 21/4853* (2013.01); *H01L 21/4875* (2013.01);
(Continued)

(58) Field of Classification Search
CPC .......... H01L 24/97; H01L 43/02; H01L 43/12
See application file for complete search history.

(56) References Cited

U.S. PATENT DOCUMENTS

| 6,545,457 B2 | 4/2003 | Goto et al. |
| 8,247,888 B2 | 8/2012 | Masuda et al. |

(Continued)

FOREIGN PATENT DOCUMENTS

| CN | 101877345 A | 11/2010 |
| CN | 102244013 A | 11/2011 |

(Continued)

OTHER PUBLICATIONS

International Search Report Issued Dec. 10, 2013 in PCT/JP13/073752 Filed Sep. 4, 2013.

(Continued)

*Primary Examiner* — Daniel Shook
(74) *Attorney, Agent, or Firm* — Oblon, McClelland, Maier & Neustadt, L.L.P.

(57) ABSTRACT

According to the embodiments, a semiconductor device includes a substrate, a plurality of insulating layers, a lower shield plate, a semiconductor device, an upper shield plate, and a side shield member. A first contact portion is formed on the substrate. The lower shield plate includes a magnetic substance and is provided above the substrate so as to avoid the first contact portion. The semiconductor chip is provided above the lower shield plate and has a second contact portion electrically connected to the first contact portion. The upper shield plate includes a magnetic substance and is provided above the semiconductor chip so as to avoid the second contact portion and a connection member. The side shield member includes a magnetic substance and connects side portions of the lower shield plate and the upper shield plate on which the connection member is not disposed.

4 Claims, 20 Drawing Sheets

(51) Int. Cl.
   *H01L 23/00*    (2006.01)
   *H01L 21/56*    (2006.01)
   *H01L 21/78*    (2006.01)
   *H01L 23/498*   (2006.01)
   H01L 23/58      (2006.01)
   H01L 23/31      (2006.01)

(52) U.S. Cl.
   CPC .......... *H01L 21/4878* (2013.01); *H01L 21/56* (2013.01); *H01L 21/78* (2013.01); *H01L 23/49811* (2013.01); *H01L 24/97* (2013.01); H01L 23/3121 (2013.01); H01L 2224/48091 (2013.01); H01L 2224/49175 (2013.01); H01L 2224/73265 (2013.01); H01L 2924/181 (2013.01)

(56) References Cited

U.S. PATENT DOCUMENTS

| | | | |
|---|---|---|---|
| 8,258,012 | B2 | 9/2012 | Pagaila et al. |
| 9,172,028 | B2 | 10/2015 | Watanabe et al. |
| 2013/0256819 | A1* | 10/2013 | Watanabe ............... H01L 43/02 257/422 |

FOREIGN PATENT DOCUMENTS

| | | | |
|---|---|---|---|
| JP | 2002-26419 | A | 1/2002 |
| JP | 2005-217221 | A | 8/2005 |
| JP | 2006-38640 | A | 2/2006 |
| JP | 2008-245026 | A | 10/2008 |
| JP | 2009-141194 | A | 6/2009 |
| JP | 2010-237058 | A | 10/2010 |
| JP | 2011-114225 | A | 6/2011 |
| JP | 2011-228322 | A | 11/2011 |
| JP | 2013-207059 | A | 10/2013 |
| TW | 200624032 | A | 7/2006 |

OTHER PUBLICATIONS

Taiwanese Office Action Issued Jul. 8, 2015 in Taiwanese Application No. 102131838 (with English Translation).

International Preliminary Report on Patentability and Written Opinion of the International Searching Authority issued Mar. 17, 2016 in PCT/JP2013/073752 (with English language translation).

* cited by examiner (a)　　　　　　　　　　　(b)

SEMICONDUCTOR APPARATUS AND MANUFACTURING METHOD FOR SAME

TECHNICAL FIELD

The embodiments described herein relate to a semiconductor device and a method for producing the same.

BACKGROUND ART

Some semiconductor devices are susceptible to an external magnetic field. Such semiconductor devices that are susceptible to a magnetic field can be suitably operated by reducing the influence of an external magnetic field by using a magnetic shield. An example of a known magnetic shield used for a semiconductor device is an electromagnetic wave absorption mold resin that contains a high-magnetic-permeability material as a filler and that covers an upper surface and a side surface of a semiconductor chip.

CITATION LIST

Patent Literature
Patent Literature 1: JP 2005-217221 A

SUMMARY OF INVENTION

Problem to be Solved by the Invention

The embodiments described herein provide a semiconductor device that has an enhanced magnetic shield effect, and a method for producing the same.

Means for Solving the Problem

A semiconductor device according to the embodiments includes a substrate, a lower shield plate, a semiconductor chip, a connection member, an upper shield plate, and a side shield member. A first contact portion is formed on the substrate. The lower shield plate includes a magnetic substance and is provided above the substrate so as to avoid the first contact portion. The semiconductor chip is provided above the lower shield plate and has a second contact portion electrically connected to the first contact portion. The connection member electrically connects the first contact portion and the second contact portion. The upper shield plate includes a magnetic substance and is provided above the semiconductor chip so as to avoid the second contact portion and the connection member. The side shield member includes a magnetic substance and connects side portions of the lower shield plate and the upper shield plate on which the connection member is not disposed.

DESCRIPTION OF EMBODIMENTS

Figure 1:
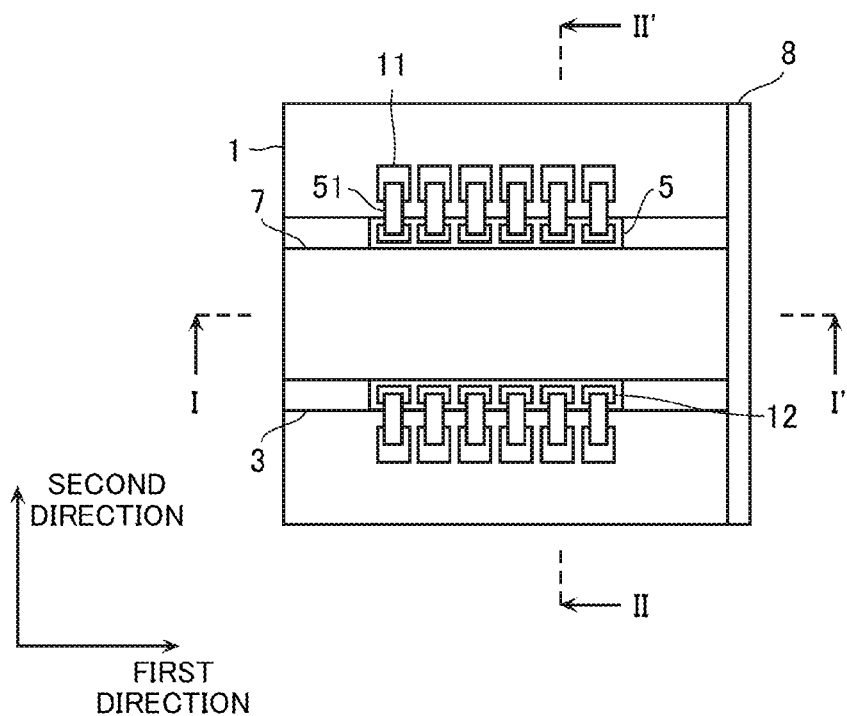
FIG. 1 is a plan view schematically illustrating a semiconductor device according to first embodiment.

Semiconductor devices according to the embodiments are described below with reference to the drawings. Note that the drawings are schematic ones, and a relationship between a thickness and a planar dimension, a ratio of thicknesses of respective layers, and the like in the drawings are different from actual ones. Terms indicative of directions such as "upper" and "lower" in the description indicate relative directions assuming that a circuit formation surface side of a semiconductor chip that will be described later is an "upper" side, and the directions indicated by these terms may be sometimes different from actual directions based on a gravitational acceleration direction.

[Configuration of Semiconductor Device According to First Embodiment]

Figure 2:
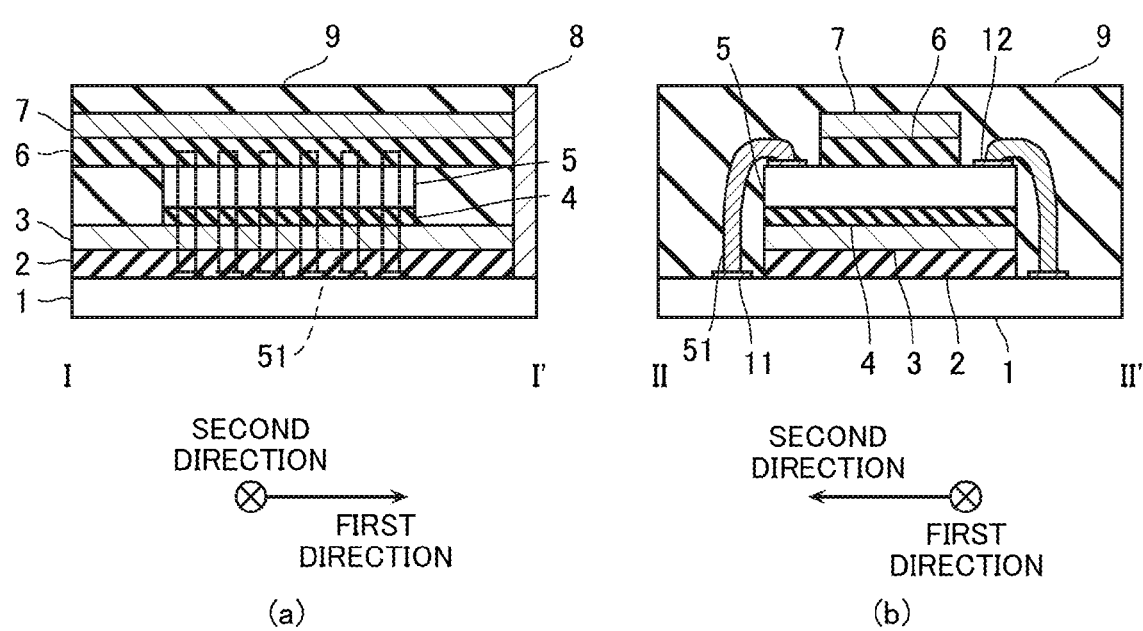
FIG. 2 is side views schematically illustrating the semiconductor device.

First, a configuration of a semiconductor device according to first embodiment is described with reference to FIGS. 1 and 2. FIG. 1 is a plan view schematically illustrating a semiconductor device according to first embodiment. FIG. 2(a) is a cross-sectional view taken along the line I-I' in FIG. 1, and FIG. 2(b) is a cross-sectional view taken along the line II-II' in FIG. 1.

As illustrated in FIGS. 1 and 2, the semiconductor device according to the present embodiment includes a substrate 1, a lower shield plate 3 attached onto the substrate 1 with an insulating first adhesive 2 sandwiched therebetween, a semiconductor chip 5 mounted on the lower shield plate 3 with an insulating second adhesive 4 sandwiched therebetween, an upper shield plate 7 attached onto an upper surface of the semiconductor chip 5 with an insulating third adhesive 6 sandwiched therebetween, and a side shield member 8 that couples the lower shield plate 3 and the upper shield plate 7 on a side thereof. At least part of the first adhesive 2, the lower shield plate 3, the second adhesive 4, the semiconductor chip 5, the third adhesive 6, the upper shield plate 7, and the side shield member 8 is embedded in an insulating resin 9. In FIG. 1, illustration of the insulating resin 9 is omitted for explanation.

In the present embodiment, an insulating material such as ceramics, a resin, or silicon (Si) whose surface has been oxidized is used as the substrate 1. Wires (not illustrated) and contact portions 11 (first contact portions) that are connected to the wires are provided on a surface of the substrate 1. The wires and the contact portions 11 are formed by printing, vapor deposition, or another method by using a metal such as copper. The contact portions 11 are bonding pads connected to the semiconductor chip 5 and are aligned at predetermined intervals along both side surfaces of the lower shield plate 3 in a direction (hereinafter referred to as a "first direction") in which the lower shield plate 3 extends.

The lower shield plate 3 is a rectangle whose longitudinal direction is the first direction, and the first adhesive 2 is attached onto a lower surface thereof. The length of the lower shield plate 3 in the first direction is longer than that of the semiconductor chip 5 in the first direction. The width of the lower shield plate 3 in a direction (hereinafter referred to as a "second direction") orthogonal to the first direction is smaller than an interval between the contact portions 11 in the second direction and is almost the same as the width of the semiconductor chip 5 in the second direction. A high-magnetic-permeability material is used as the lower shield plate 3. In the present embodiment, a magnetic alloy containing iron such as PC permalloy (Ni—Mo, Cu—Fe) is used. Note that in the present embodiment, the thickness of the lower shield plate 3 is approximately 50 μm to 150 μm.

The semiconductor chip 5 includes an integrated circuit. In the present embodiment, a storage device in which a plurality of data are magnetically stored is mounted as the semiconductor chip 5. The storage device may be, for example, one in which data is written by spin injection and the written data is discriminated on the basis of a change of resistance caused by a tunnel magneto resistance effect. Note that a different storage device may be mounted as the semiconductor chip 5 or a device other than a storage device may be mounted as the semiconductor chip 5.

The second adhesive 4 is attached onto a lower surface of the semiconductor chip 5, and contact portions 12 (second contact portions) are provided on an upper surface of the semiconductor chip 5 on both sides in the second direction. The contact portions 12 are electrically connected to the contact portions 11 via bonding wires 51 that are a plurality of connection members.

The upper shield plate 7 is a rectangle whose longitudinal direction is the first direction, and the third adhesive 6 is attached onto a lower surface thereof. The width of the upper shield plate 7 in the second direction is smaller than that of the contact portions 12 in the second direction. The length of the upper shield plate 7 in the first direction is the same as that of the lower shield plate 3 in the first direction. A high-magnetic-permeability material is used as the upper shield plate 7 as with the lower shield plate 3. In the present embodiment, a magnetic alloy containing iron such as PC permalloy (Ni—Mo, Cu—Fe) is used. In the present embodiment, the thickness of the upper shield plate 7 is approximately 50 μm to 150 μm.

The side shield member 8 functions as a magnetic shield that protects the semiconductor chip 5 from an external magnetic field together with the lower shield plate 3 and the upper shield plate 7. The side shield member 8 is in contact with the lower shield plate 3 and the upper shield plate 7 in the first direction. A high-magnetic-permeability material is used as the side shield member 8 as with the lower shield plate 3 and the upper shield plate 7. In the present embodiment, plating, a resin containing a magnetic substance, or the like is used as the side shield member 8.

The width of the side shield member 8 in the first direction can be adjusted as appropriate. For example, the width of the side shield member 8 in the first direction can be adjusted so that a difference between the magnetic permeability of the lower shield plate 3 and the upper shield plate 7 and the magnetic permeability of the side shield member 8 is offset. Furthermore, it is also possible that the shield function be enhanced by making the width of the side shield member 8 larger than those of the lower shield plate 3 and the upper shield plate 7.

In the semiconductor device according to the present embodiment, the lower surface of the semiconductor chip 5 is covered with the lower shield plate 3, the upper surface of the semiconductor chip 5 is covered with the upper shield plate 7, and the side surface of the semiconductor chip 5 is covered with the side shield member 8. Furthermore, the width of the lower shield plate 3 in the second direction is almost the same as that of the semiconductor chip 5 in the second direction, and although the width of the upper shield plate 7 in the second direction is slightly smaller than that of the semiconductor chip 5 in the second direction, a main portion of the semiconductor chip 5 is suitably protected from an external magnetic field. The width of the lower shield plate 3 and the width of the upper shield plate 7 are set to ones that can prevent the lower shield plate 3 and the upper shield plate 7 from making contact with the bonding wires 51 drawn out from the semiconductor chip 5 and the contact portions 11 and 12. With the arrangement, the lower surface of the semiconductor device 5 can also be protected from an external magnetic field, thereby allowing the semiconductor device according to the present embodiment to operate well. Note that the width of the lower shield plate 3 in the second direction may be almost the same as that of the upper shield plate 7 in the second direction, as long as a main portion of the semiconductor chip 5 is protected.

[Method for Producing Semiconductor Device According to First Embodiment]

Next, a method for producing the semiconductor device according to the present embodiment is described. FIGS. 3, 5, 7, 9, 11, and 13 are plan views for explaining a method for producing the semiconductor device according to the present embodiment, and FIGS. 4, 6, 8, 10, 12, and 14 are cross-sectional views for explaining a method for producing the semiconductor device according to the present embodiment.

Figure 3:
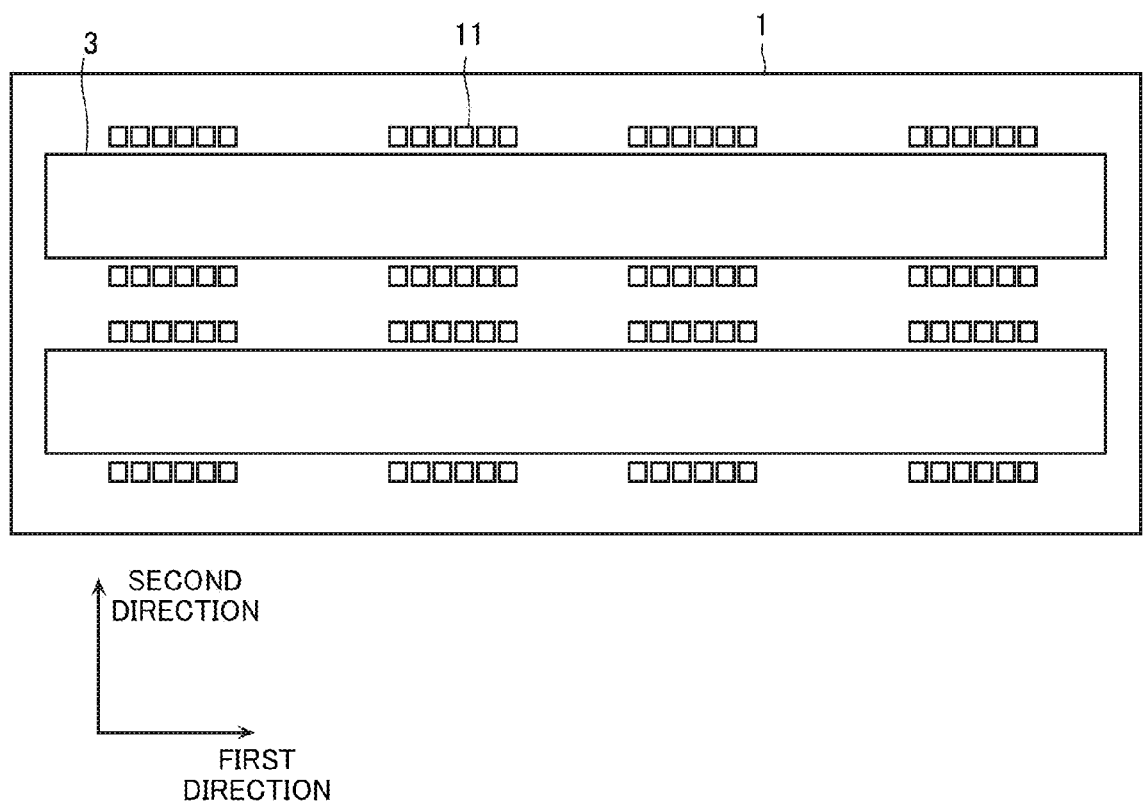
FIG. 3 is a plan view schematically illustrating a method for producing the semiconductor device.
Figure 4:
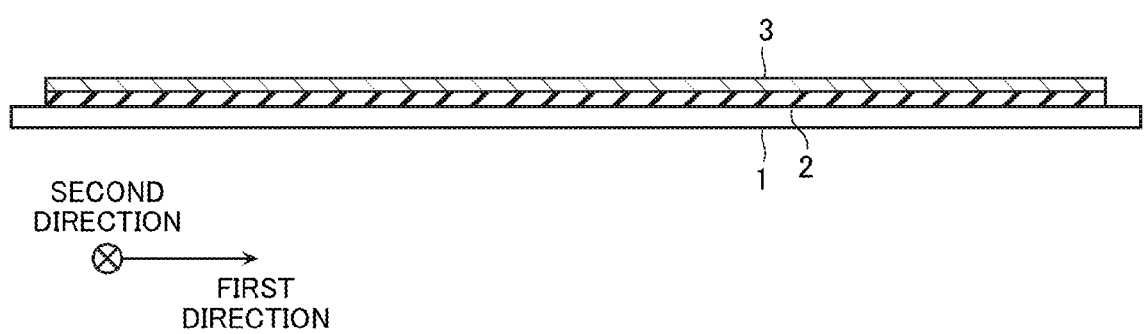
FIG. 4 is a side view schematically illustrating a method for producing the semiconductor device.

In the method for producing the semiconductor device according to the present embodiment, first, the substrate 1 on which the wires (not illustrated) and the contact portions 11 are provided is prepared as illustrated in FIGS. 3 and 4. The substrate 1 is a rectangle whose longitudinal direction is the first direction and whose width direction is the second direction, and eight groups of the wires and the contact portions 11 are provided on the substrate 1 so that eight semiconductor devices in total (four semiconductor devices in the longitudinal direction and two semiconductor devices in the width direction) can be produced. The contact portions 11 are provided along the longitudinal direction so that a predetermined space is formed in the width direction. Two lower shield plates 3 extending in the first direction are placed in parallel with each other in respective two spaces formed between the contact portions 11 of the substrate 1 in the width direction and are adhered by using the first adhesive 2.

In the present embodiment, the lower shield plates 3 are placed on the substrate 1 in a state where the first adhesive 2 is attached or applied onto rear surfaces of the lower shield plates 3. However, for example, the first adhesive 2 may be applied to the substrate 1 side.

Figure 5:
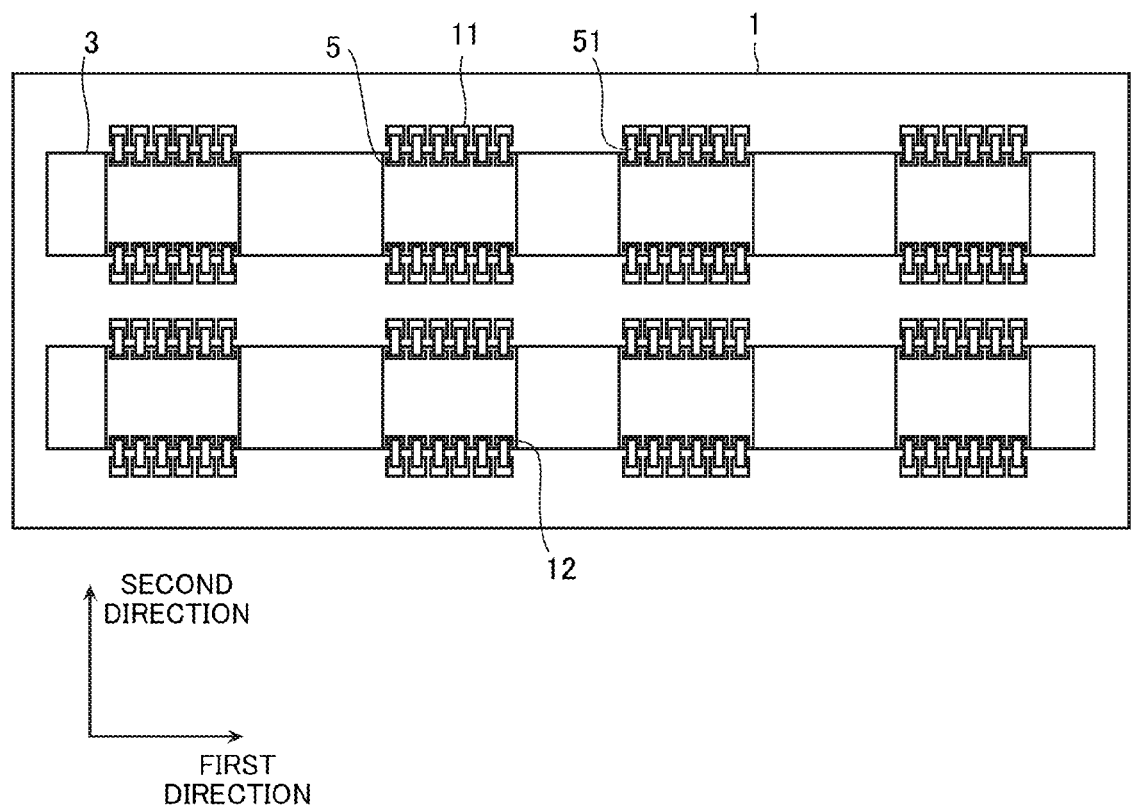
FIG. 5 is a plan view schematically illustrating a method for producing the semiconductor device.
Figure 6:
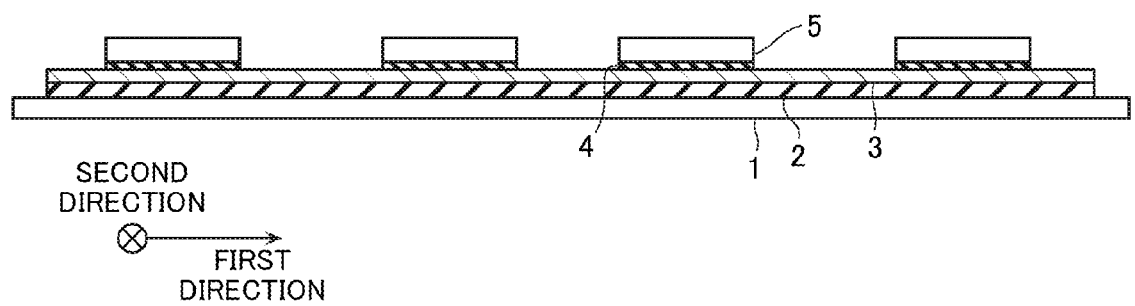
FIG. 6 is a side view schematically illustrating a method for producing the semiconductor device.

Next, as illustrated in FIGS. 5 and 6, eight semiconductor chips 5 are mounted on the lower shield plates 3 at predetermined intervals in the first direction and the second direction. The semiconductor chips 5 are placed on the lower shield plates 3 so that the contact portions 12 provided on the upper surfaces of the semiconductor chips 5 correspond to the contact portions 11 provided on the substrate 1. In the present embodiment, the second adhesive 4 is attached or applied onto the lower surfaces of the semiconductor chips 5, and then semiconductor chips 5 are placed on the lower shield plates 3. However, for example, the semiconductor devices 5 may be placed on the lower shield plates 3 onto which the second adhesive 4 has been attached or applied.

Next, the contact portions 12 of the semiconductor chips 5 and the contact portions 11 of the substrate 1 are electrically connected to each other via the bonding wires 51. In the present embodiment, the width of each of the semiconductor chips 5 in the second direction is almost the same as that of each of the lower shield plates 3 in the second direction. This makes it possible to prevent contact between the bonding wires 51 drawn out from the semiconductor chips 5 and the lower shield plates 3.

Figure 7:
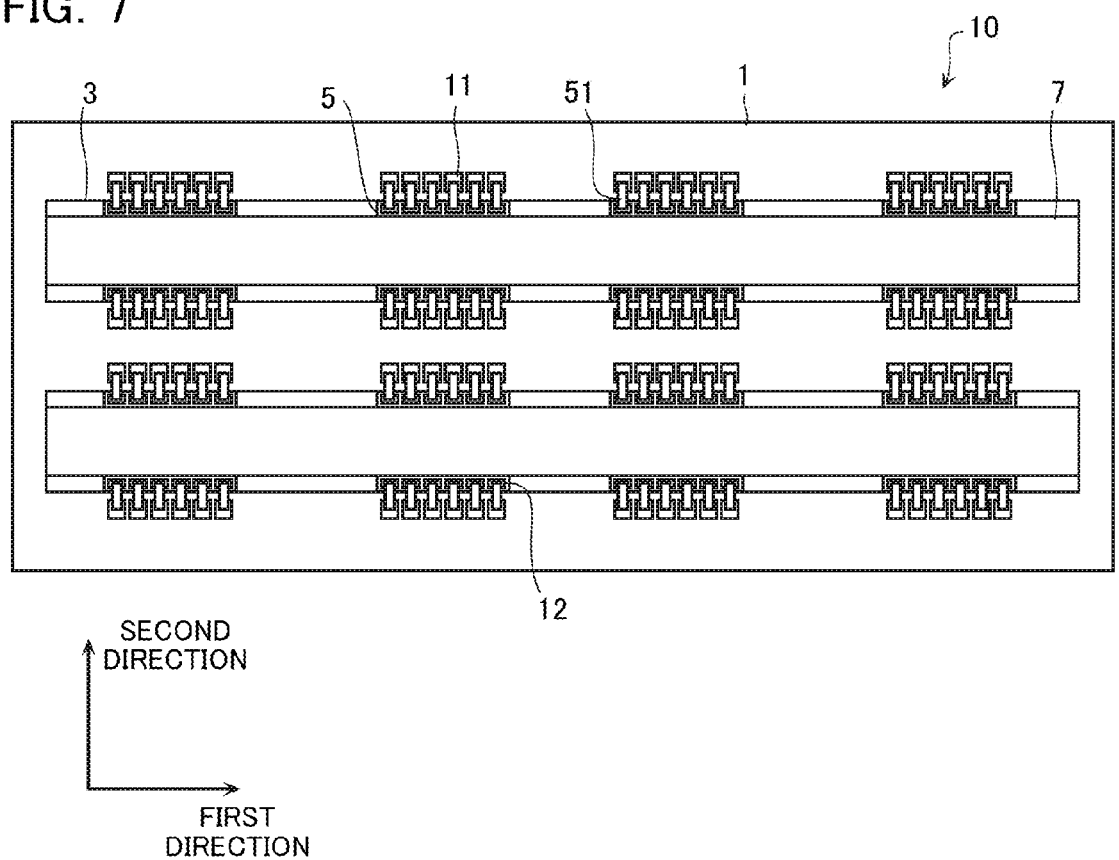
FIG. 7 is a plan view schematically illustrating a method for producing the semiconductor device.
Figure 8:
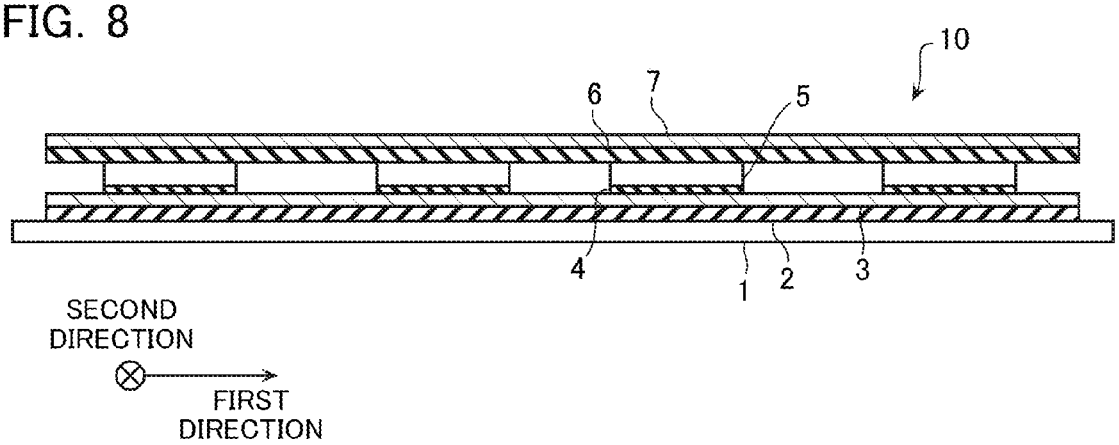
FIG. 8 is a side view schematically illustrating a method for producing the semiconductor device.

Next, as illustrated in FIGS. 7 and 8, the upper shield plates 7 extending in the first direction are attached onto the semiconductor chips 5 by using the third adhesive 6. The upper shield plates 7 are placed in respective spaces between the contact portions 12 on the upper surfaces of the semiconductor chips 5.

In the present embodiment, the third adhesive 6 is attached or applied onto the lower surfaces of the upper shield plates 7, and then the upper shield plates 7 are placed on the upper surfaces of the semiconductor chips 5. However, for example, the upper shield plates 7 may be placed onto the semiconductor chips 5 on which the third adhesive 6 has been attached or applied. Note that in the present embodiment, the width of each of the upper shield plates 7 in the second direction is smaller than the width of each of the semiconductor chips 5 in the second direction and the width of each of the lower shield plates 3 in the second direction. This makes it possible to suitably prevent contact between the bonding wires 51 and the upper shield plates 7.

Figure 9:
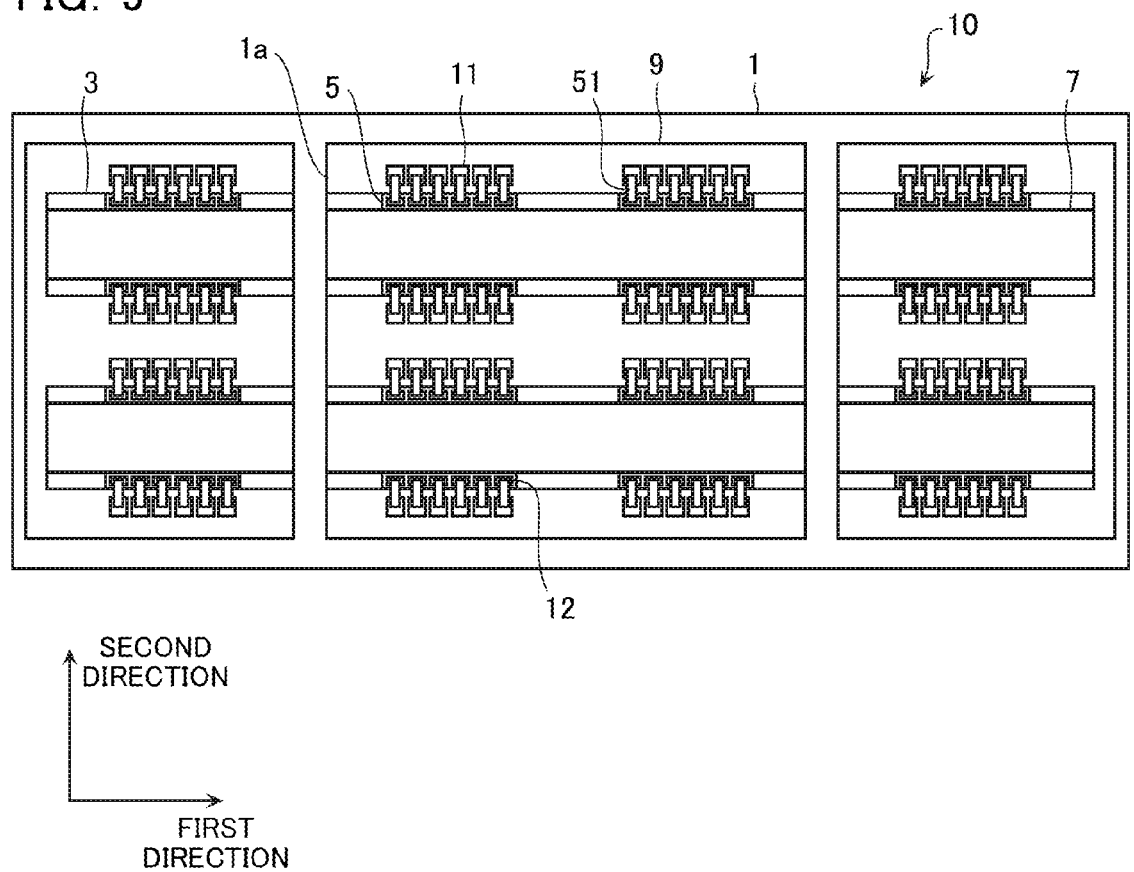
FIG. 9 is a plan view schematically illustrating a method for producing the semiconductor device.
Figure 10:
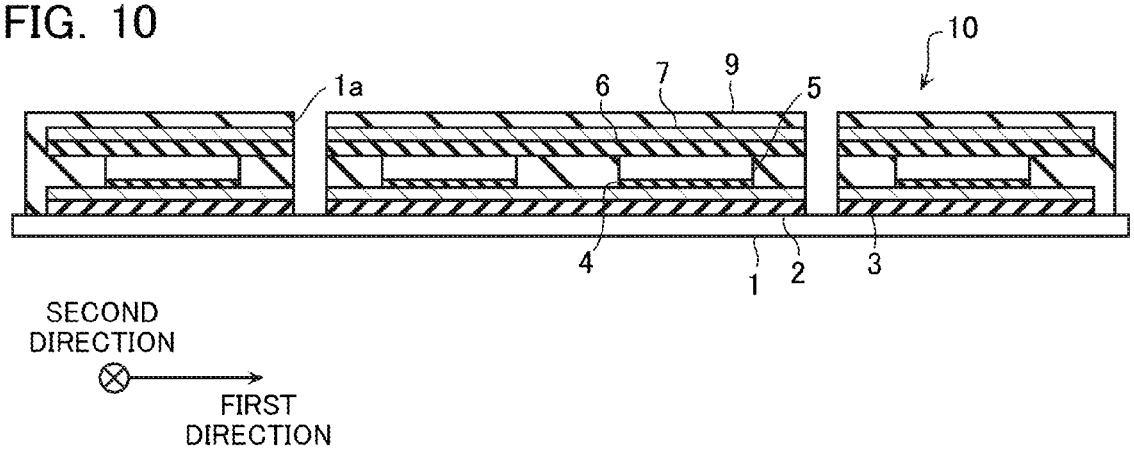
FIG. 10 is a side view schematically illustrating a method for producing the semiconductor device.

Next, as illustrated in FIGS. 9 and 10, the lower shield plates 3, the semiconductor chips 5, and the upper shield plates 7 on the substrate 1 are embedded in the insulating resin 9, so that a block 10 is formed. Subsequently, first grooves 1a extending in the second direction are formed in the block 10. The first grooves 1a are formed between the first and second ones of the semiconductor chips 5 from the left in the first direction and between the third and fourth ones of the semiconductor chips 5 from the left in the first direction. The first grooves 1a cut the lower shield plates 3, the first adhesive 2, the third adhesive 6, and the upper shield plates 7 in the first direction.

Figure 11:
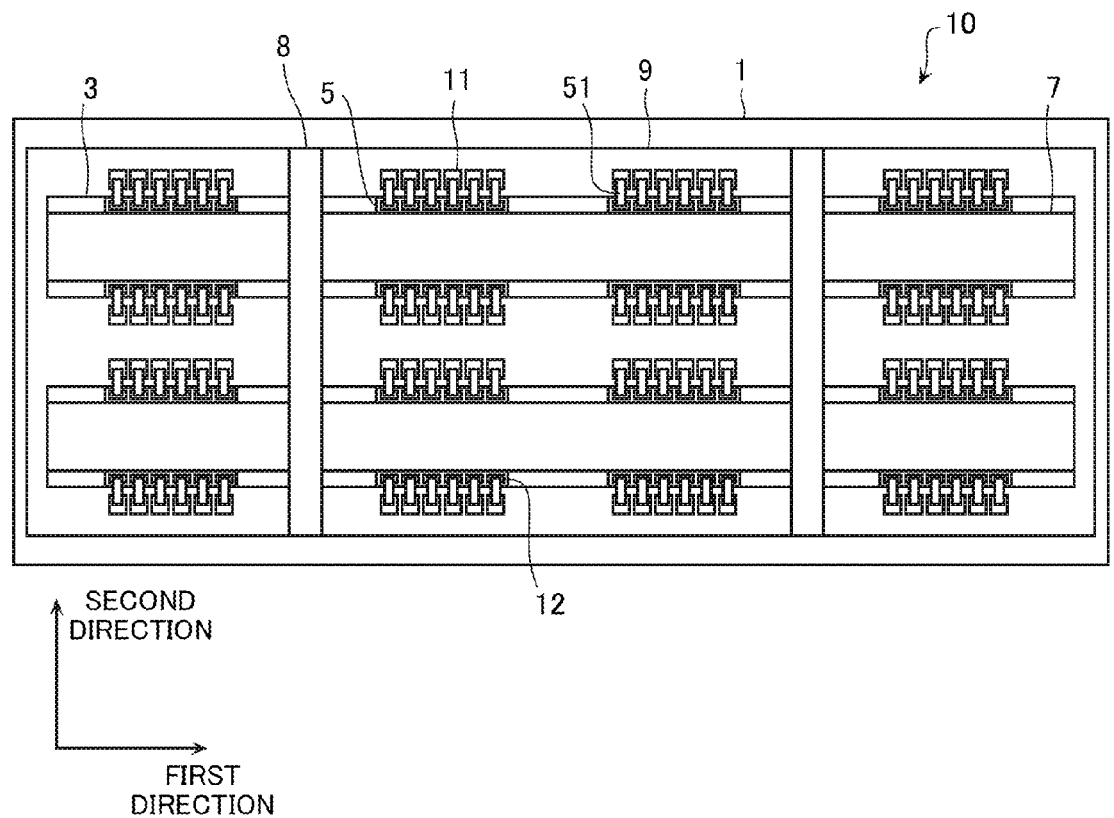
FIG. 11 is a plan view schematically illustrating a method for producing the semiconductor device.
Figure 12:
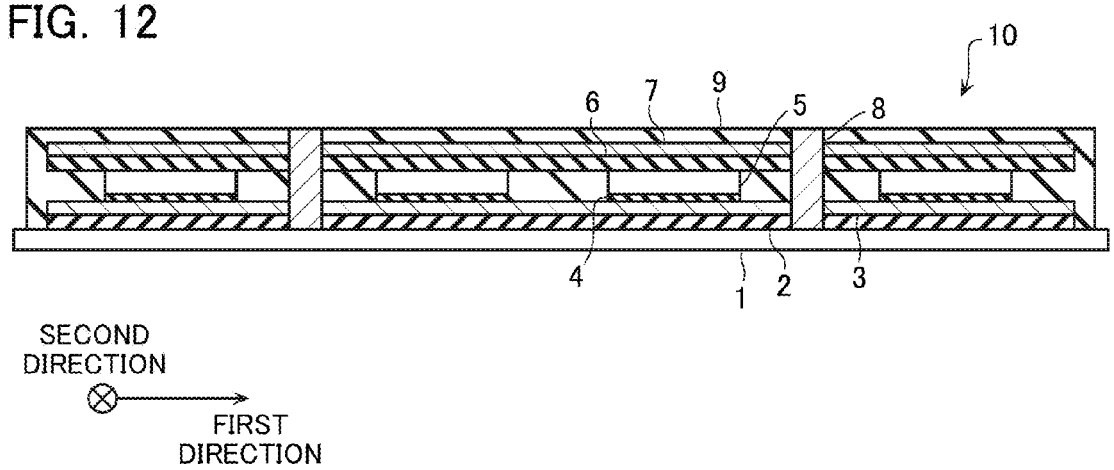
FIG. 12 is a side view schematically illustrating a method for producing the semiconductor device.

Next, as illustrated in FIGS. 11 and 12, the side shield members 8 are formed in the first grooves 1a. The side shield members 8 may be formed, for example, by plating the first grooves 1a or by filling the first grooves with a resin paste material or the like containing a magnetic substance. Alternatively, the side shield members 8 may be formed, for example, by inserting a magnetic metal into the first grooves and then plating gaps between the magnetic metal and side surfaces of each of the first grooves or filling the gaps with a resin or the like containing a magnetic substance.

Note that in a case where a flowable material such as a resin containing a magnetic substance is used, a wall may be provided at start and end points of each of the first grooves 1a in order to prevent the material from flowing out from the substrate 1.

Figure 13:
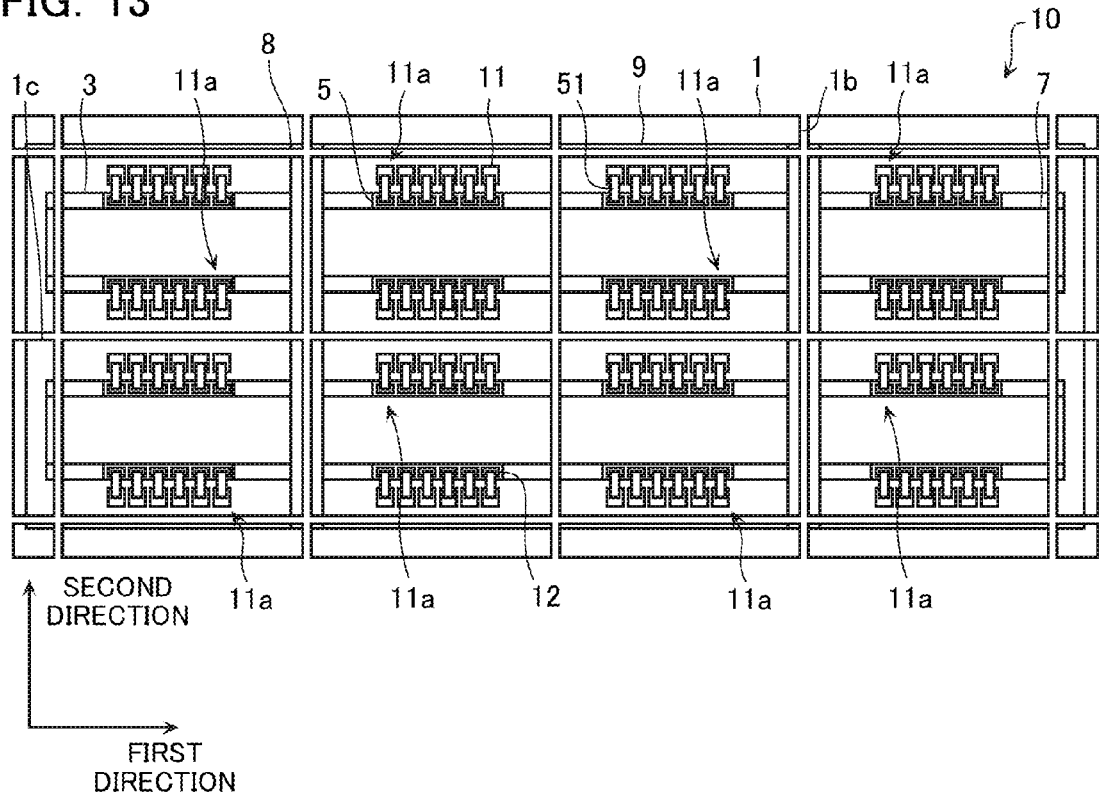
FIG. 13 is a plan view schematically illustrating a method for producing the semiconductor device.
Figure 14:
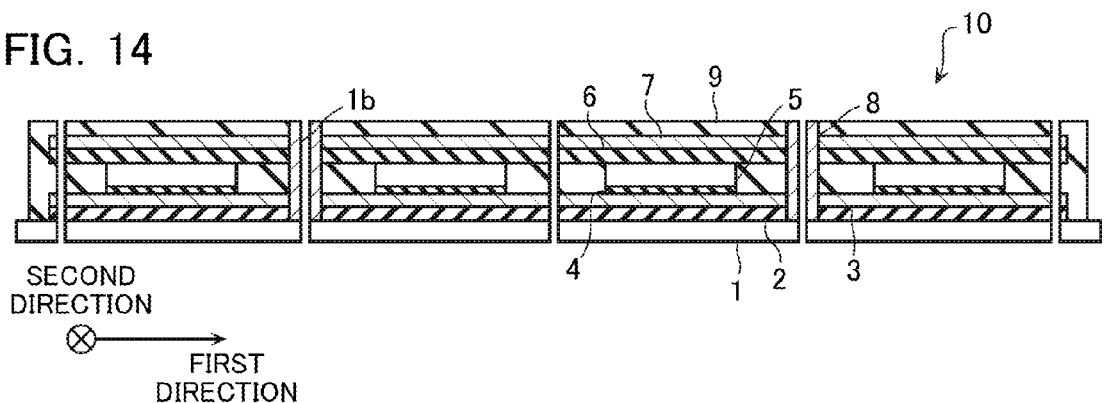
FIG. 14 is a side view schematically illustrating a method for producing the semiconductor device.

Next, as illustrated in FIGS. 13 and 14, second grooves 1b extending in the second direction and third grooves 1c extending in the first direction are formed between the semiconductor chips 5, so that individual semiconductor devices are obtained. Furthermore, excess portions such as portions of the substrate 1 and the insulating resin 9 that are not included in the semiconductor devices are cut off by the second grooves 1b and the third grooves 1c. The width of each of the second grooves 1b is smaller than that of each of the first grooves 1a. The side shield member 8 remains in each of the semiconductor devices obtained by cutting the block 10 along the second grooves 1b, and thus the semiconductor devices each having a configuration in which the lower shield plate 3 and the upper shield plate 7 are coupled by the side shield member 8 are produced.

Note that in FIG. 13, functions of contact portions 11a, and the bonding wires 51 and the contact portions 12 connected to the contact portions 11a in each of the individual semiconductor devices are similar to those in another one of the semiconductor devices. Furthermore, in FIG. 13, functions of the contact portions 11a, and the bonding wires 51 and the contact portions 12 connected to the contact portions 11a in the first one of the semiconductor devices from the left are the same as those at corresponding positions in the third one of the semiconductor devices from the left. Furthermore, in FIG. 13, functions of the contact portions 11a, and the bonding wires 51 and the contact portions 12 connected to the contact portions 11a in the second and fourth ones of the semiconductor devices from the left that have been rotated by 180 degrees within a plane defined by the first direction and the second direction are the same as those at corresponding positions in the first and third ones of the semiconductor devices from the left.

According to the method for producing the semiconductor device according to the present embodiment, it is possible to concurrently produce a plurality of semiconductor devices, thereby reducing a production cost. Furthermore, the lower shield plate 3, the upper shield plate 7, and the side shield member 8 can be formed by a simple process.

[Semiconductor Device According to Second Embodiment]

Figure 15:
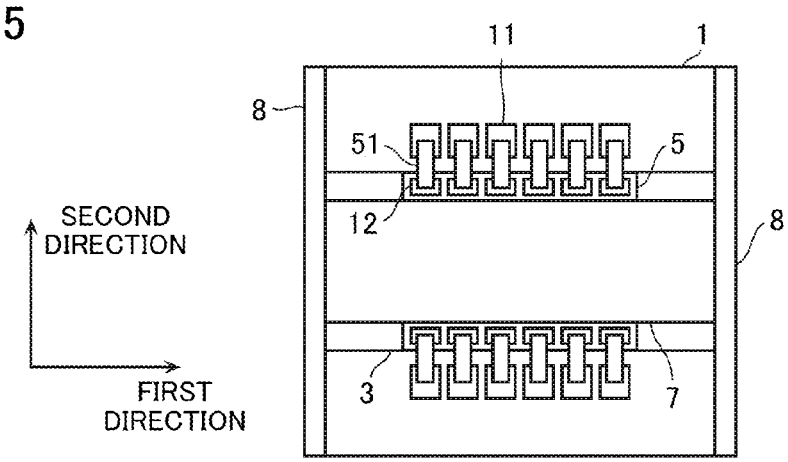
FIG. 15 is a plan view schematically illustrating a semiconductor device according to second embodiment.
Figure 16:
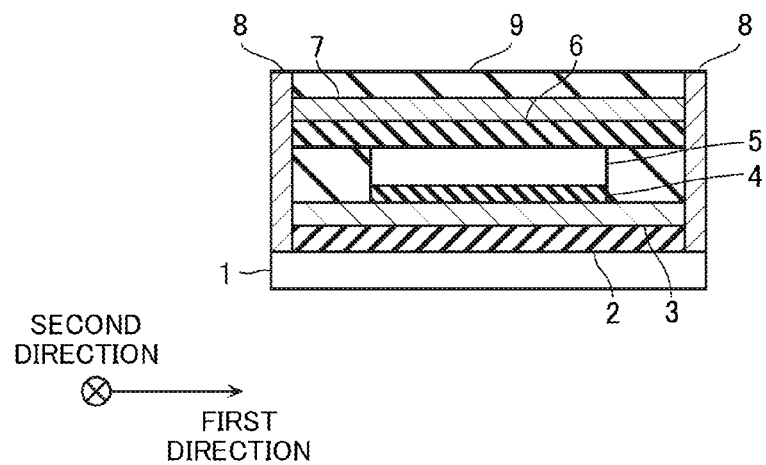
FIG. 16 is a side view schematically illustrating the semiconductor device.

Next, a configuration of a semiconductor device according to second embodiment is described. FIG. 15 is a plan view illustrating a schematic configuration of a semiconductor device according to second embodiment, and FIG. 16 is a cross-sectional view illustrating a schematic configuration of the semiconductor device according to second embodiment. The semiconductor device according to the present embodiment has a configuration that is basically almost the same as the semiconductor device according to first embodiment, but includes two side shield members 8 as illustrated in FIGS. 15 and 16. The two side shield members 8 are in contact with a lower shield plate 3 and an upper shield plate 7 on both sides in the first direction.

In the present embodiment, the two side shield members 8, the lower shield plate 3, and the upper shield plate 7 function as a box-shaped magnetic shield having no wall only on one pair of sides facing each other. In the semiconductor device according to the present embodiment, more pathways through which a magnetic field received by the lower shield plate 3 is transmitted to the upper shield plate 7 or a magnetic field received by the upper shield plate 7 is transmitted to the lower shield plate 3 are provided. This can make shielding performance higher than that in the semiconductor device according to first embodiment.

Figure 17:
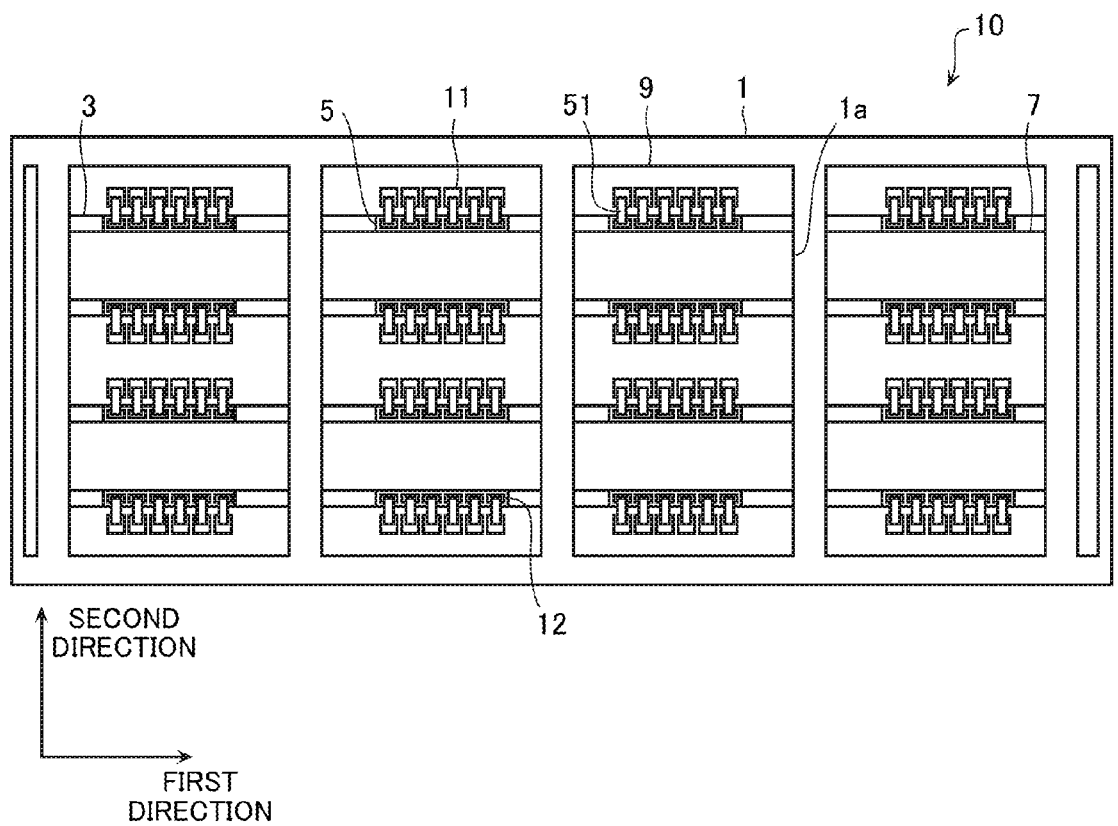
FIG. 17 is a plan view schematically illustrating a method for producing the semiconductor device.
Figure 18:
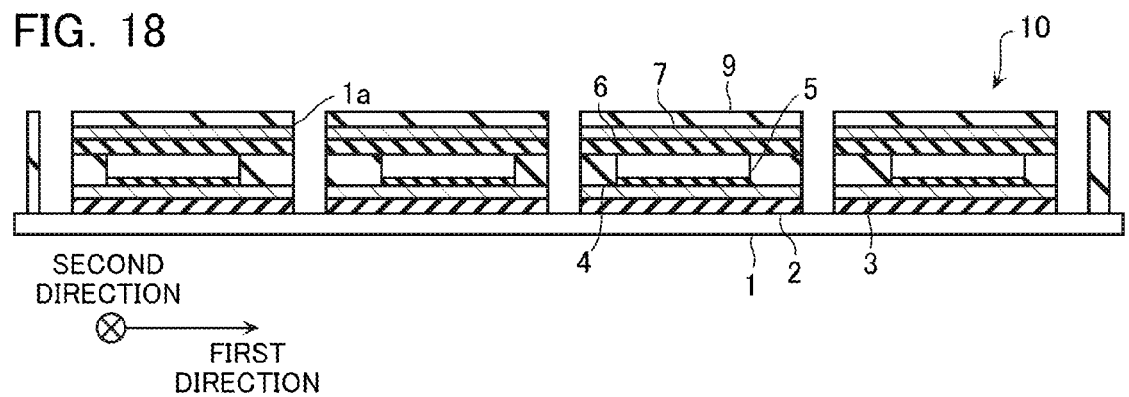
FIG. 18 is a side view schematically illustrating a method for producing the semiconductor device.
Figure 19:
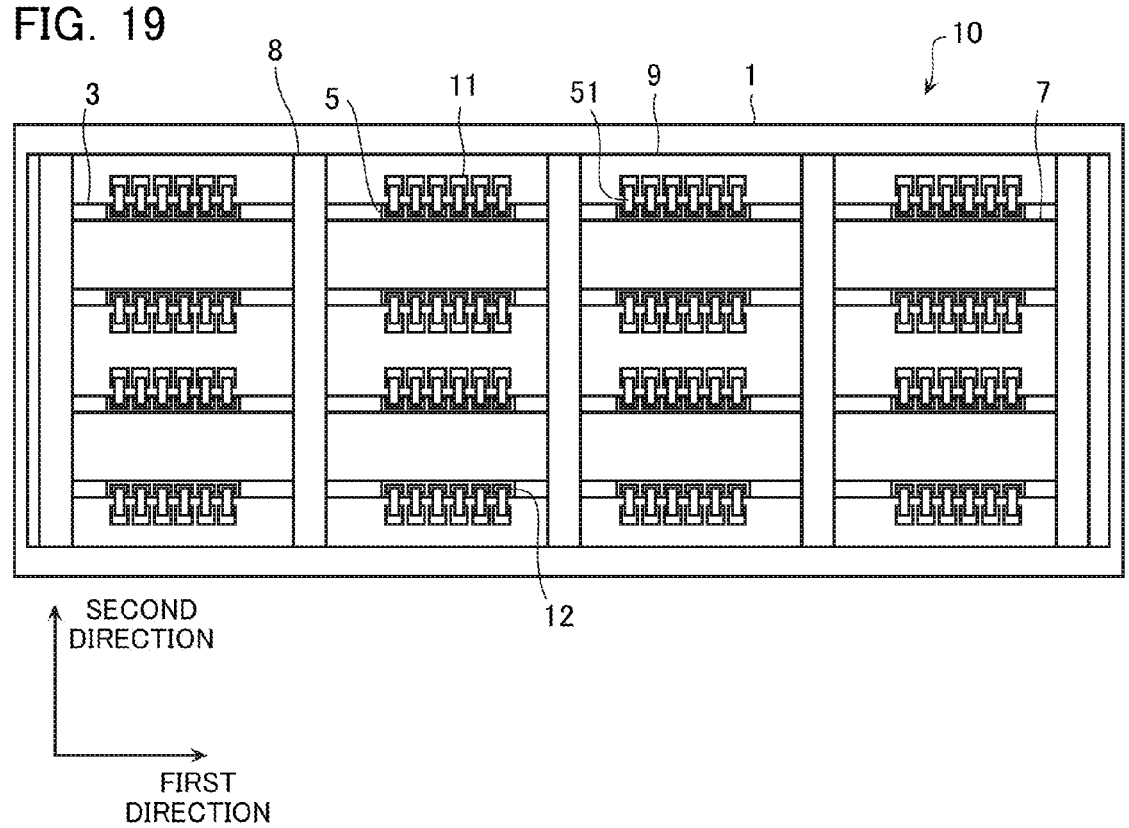
FIG. 19 is a plan view schematically illustrating a method for producing the semiconductor device.
Figure 20:
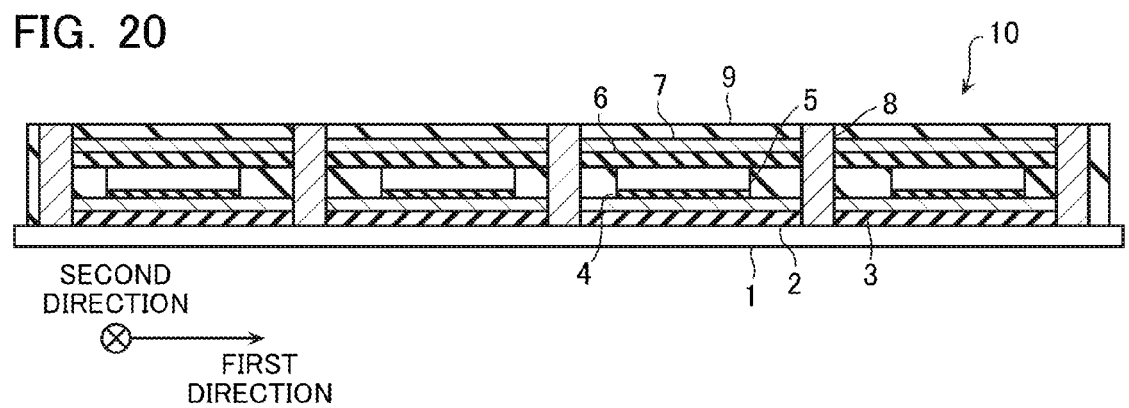
FIG. 20 is a side view schematically illustrating a method for producing the semiconductor device.
Figure 21:
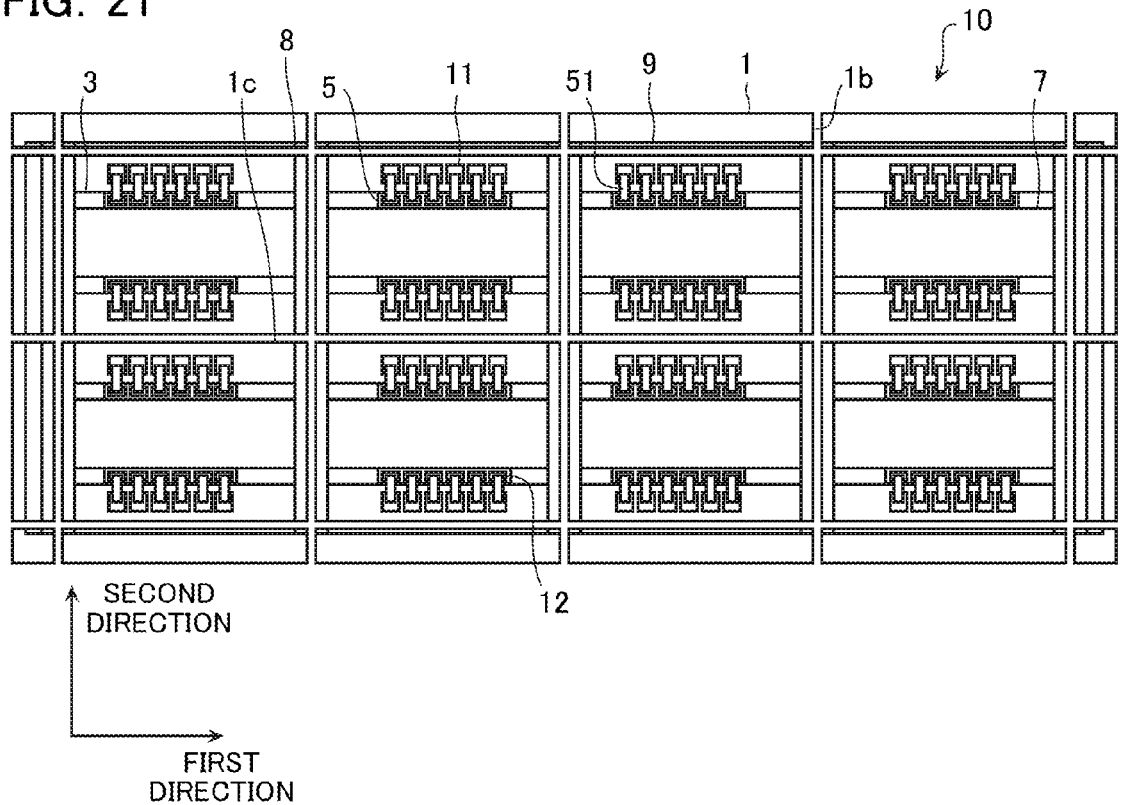
FIG. 21 is a plan view schematically illustrating a method for producing the semiconductor device.
Figure 22:
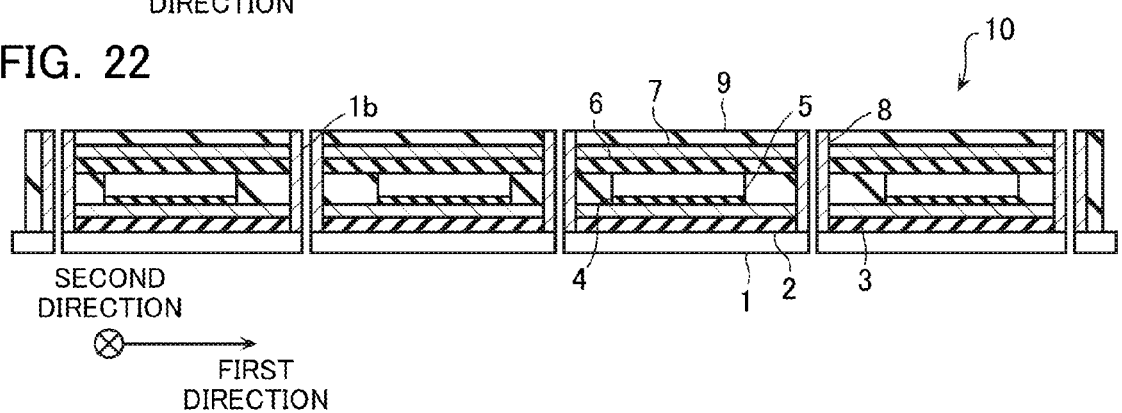
FIG. 22 is a side view schematically illustrating a method for producing the semiconductor device.

Next, a method for producing the semiconductor device according to second embodiment is described. FIGS. 17, 19, and 21 are schematic plan views for explaining the method for producing the semiconductor device according to second embodiment, and FIGS. 18, 20, and 22 are side views for explaining the method for producing the semiconductor device according to second embodiment.

The semiconductor device according to second embodiment is basically produced in almost the same manner as the semiconductor device according to first embodiment. However, in the present embodiment, a first groove 1a is formed on both sides of each of semiconductor chips 5 as illustrated in FIGS. 17 and 18. Next, the side shield member 8 is formed in all of the first grooves 1a as illustrated in FIGS. 19 and 20, and then a block 10 is cut in the first direction and the second direction by all second grooves 1b and third grooves 1c, so that individual semiconductor devices are obtained as illustrated in FIGS. 21 and 22. This makes it possible to form the semiconductor device according to the present embodiment.

[Semiconductor Device According to Third Embodiment]

Figure 23:
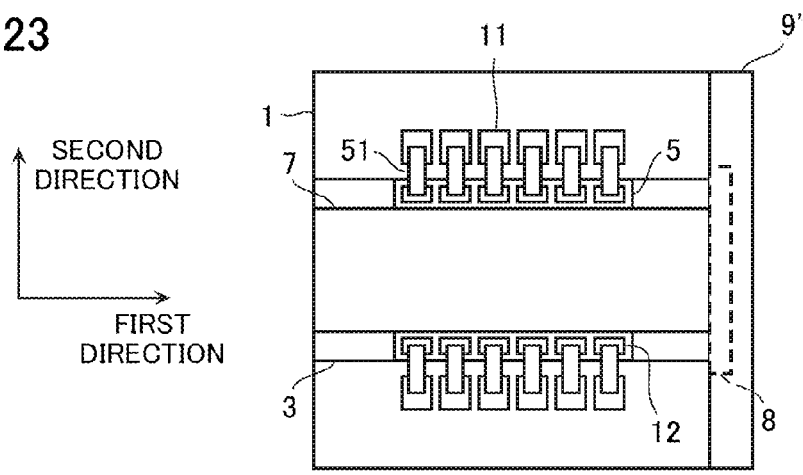
FIG. 23 is a plan view schematically illustrating a semiconductor device according to third embodiment.
Figure 24:
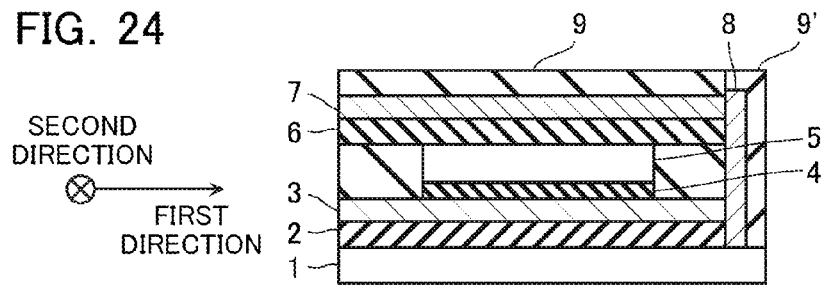
FIG. 24 is a side view schematically illustrating the semiconductor device.

Next, a configuration of a semiconductor device according to third embodiment is described. FIG. 23 is a schematic plan view for explaining a configuration of a semiconductor device according to the present embodiment, and FIG. 24 is a cross-sectional view for explaining the configuration of the semiconductor device according to the present embodiment. The semiconductor device according to third embodiment has a configuration that is basically similar to the semiconductor device according to first embodiment, but in the present embodiment, a side shield member 8 is made of a material similar to a lower shield plate 3 and an upper shield plate 7. This makes it possible to increase the magnetic permeability of the side shield member 8, thereby increasing shielding performance. The side shield member 8 is embedded an insulating resin 9'.

Figure 25:
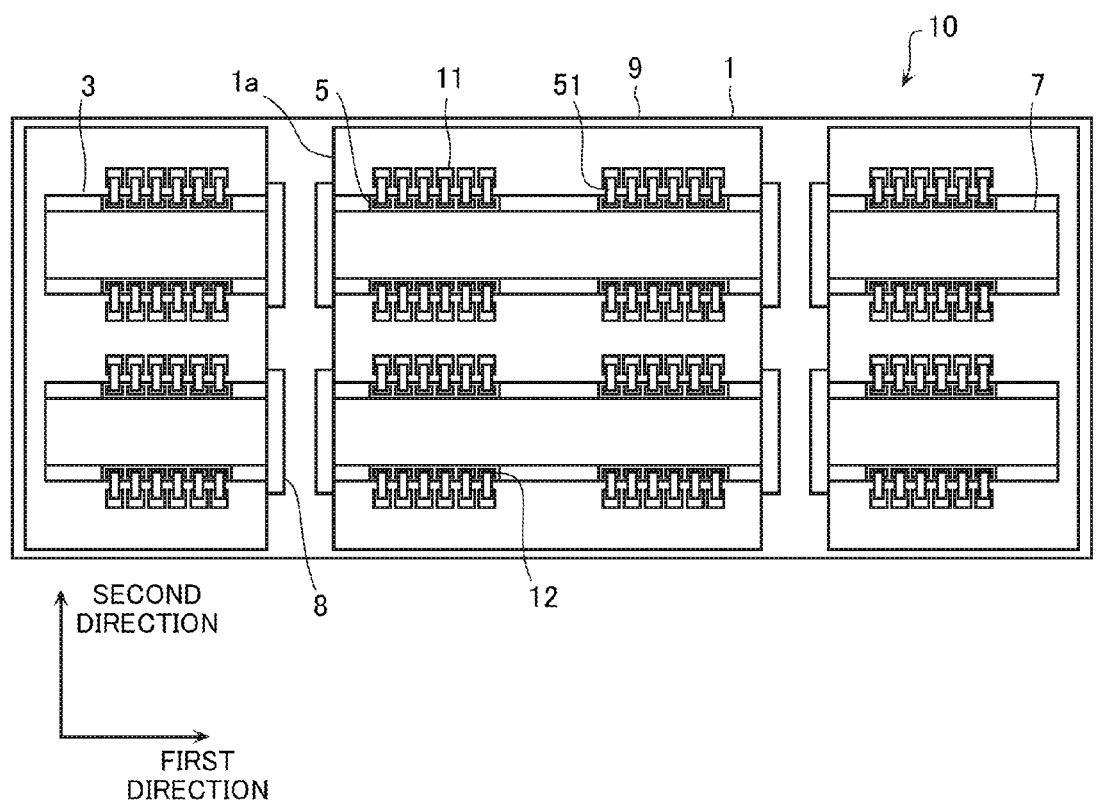
FIG. 25 is a plan view schematically illustrating a method for producing the semiconductor device.
Figure 26:
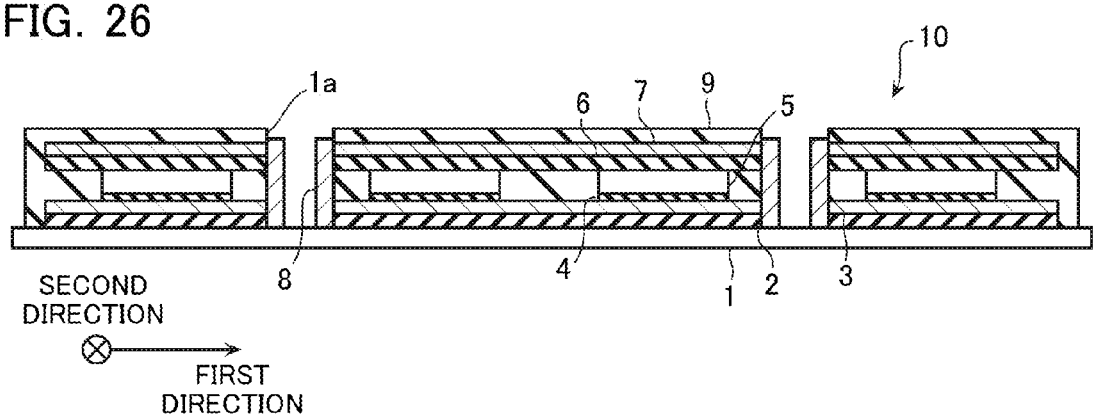
FIG. 26 is a side view schematically illustrating a method for producing the semiconductor device.
Figure 27:
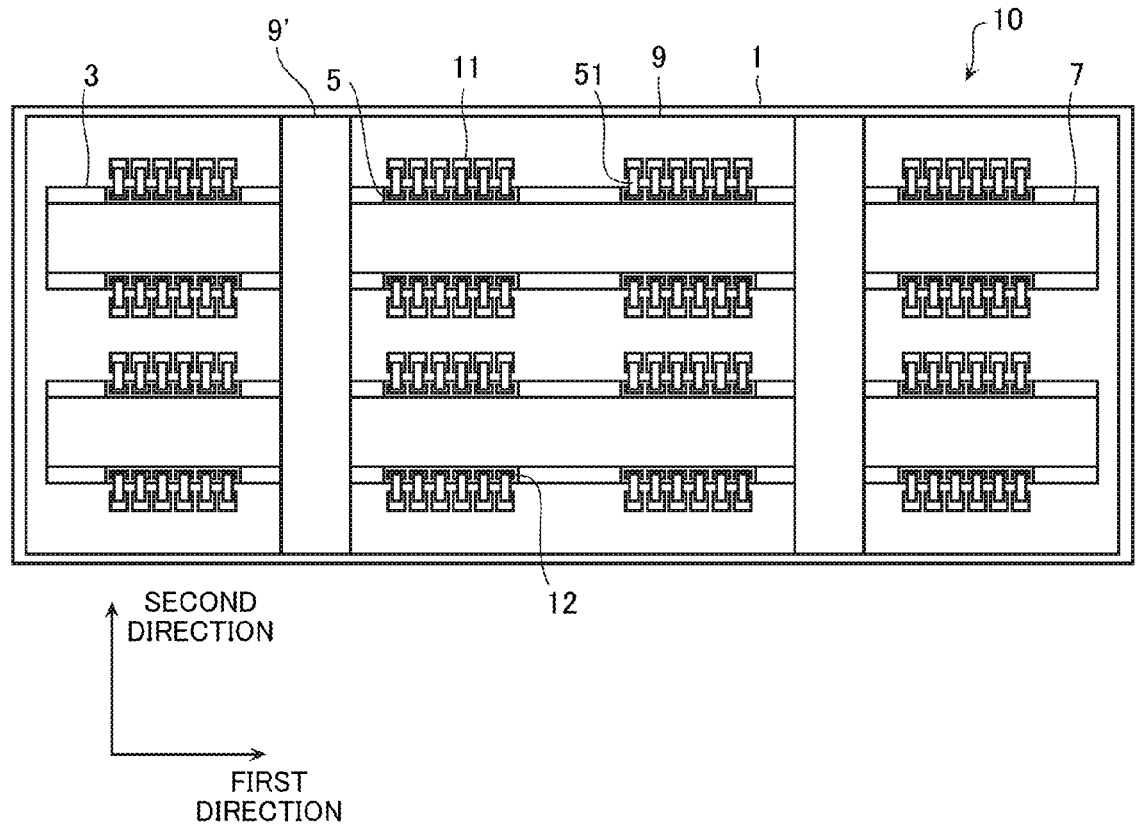
FIG. 27 is a plan view schematically illustrating a method for producing the semiconductor device.

Next, a method for producing the semiconductor device according to third embodiment is described. FIGS. 25, 27, and 29 are schematic plan views for explaining the method for producing the semiconductor device according to third embodiment, and FIGS. 26, 28, and 30 are cross-sectional views for explaining the method for producing the semiconductor device according to third embodiment.

The method for producing the semiconductor device according to the present embodiment is almost the same as the method for producing the semiconductor device according to first embodiment. However, in the present embodiment, first grooves 1a extending in the second direction are formed in a block 10 as illustrated in FIGS. 25 and 26. Next, multiple side shield members 8 extending in the second direction are placed in each of the first grooves 1a so as to be in contact with the lower shield plates 3 and the upper shield plates 7.

Figure 28:
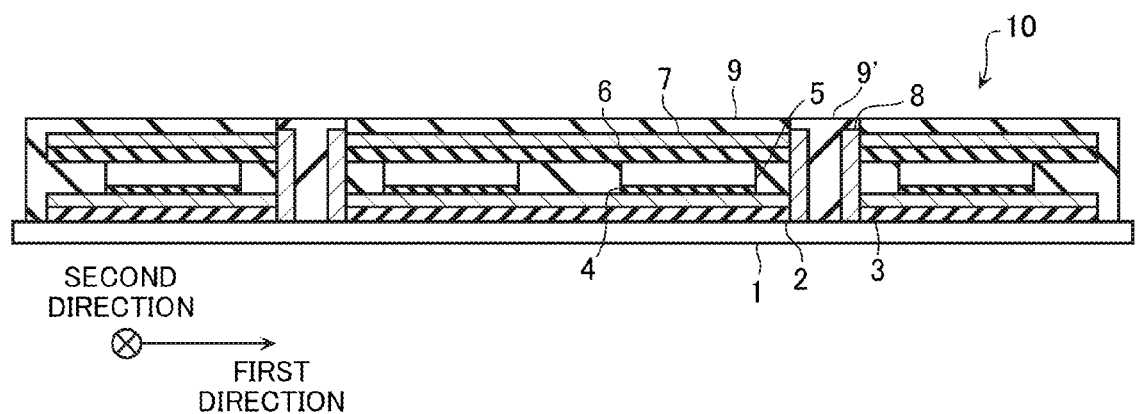
FIG. 28 is a side view schematically illustrating a method for producing the semiconductor device.
Figure 29:
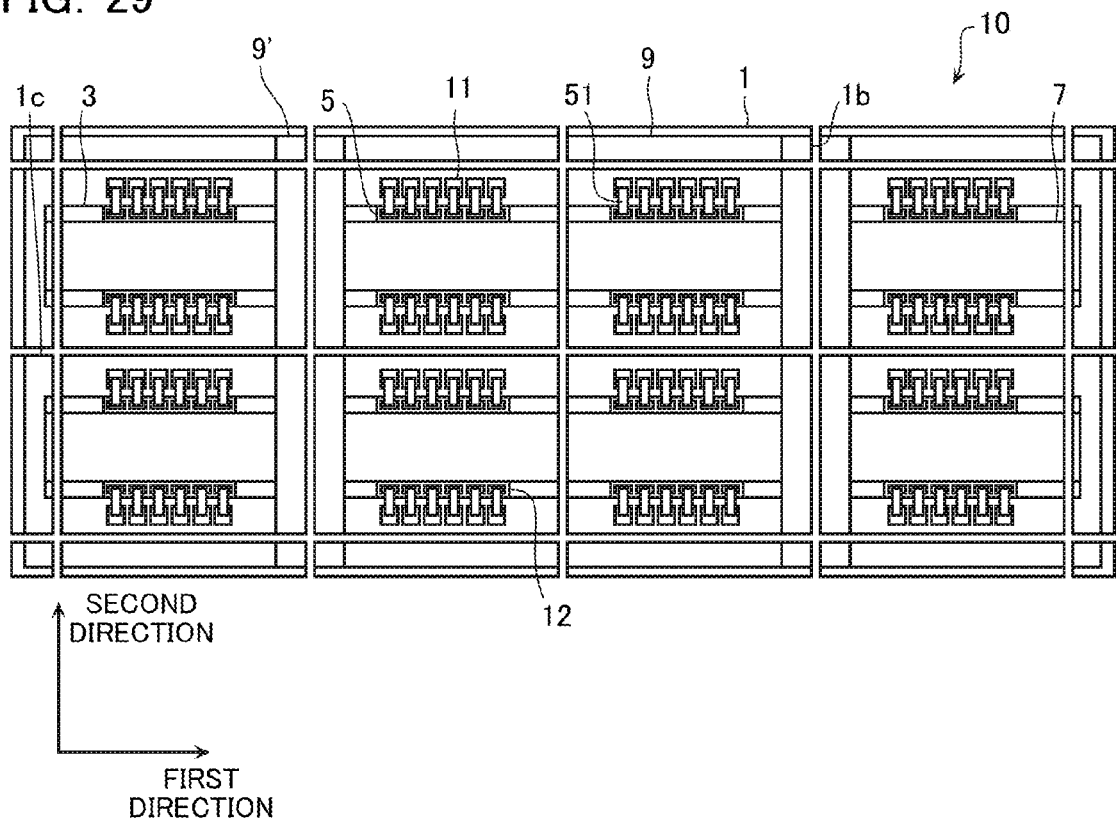
FIG. 29 is a plan view schematically illustrating a method for producing the semiconductor device.

Next, as illustrated in FIGS. 27 and 28, a space between two side shield members 8 is filled with the insulating resin 9', and the two side shield members 8 are made in close contact with the lower shield plates 3 and the upper shield plates 7 by pressure produced by the filling.

Figure 30:
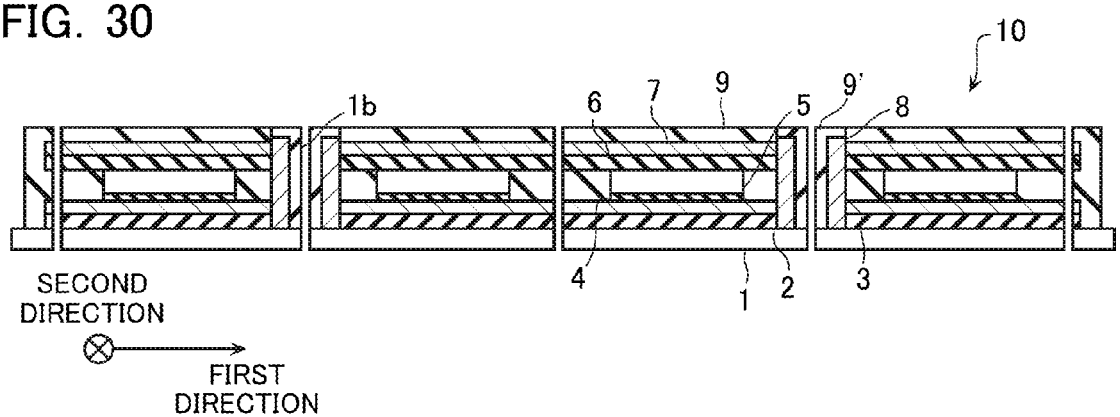
FIG. 30 is a side view schematically illustrating a method for producing the semiconductor device.

Next, as illustrated in FIGS. 29 and 30, second grooves 1b extending in the second direction and third grooves 1c extending in the first direction are formed between semiconductor chips 5, so that individual semiconductor devices are obtained. The width of each of the second grooves 1b is smaller than that of each of the first grooves 1a. The side shield member 8 and the insulating resin 9' remain in each of the semiconductor devices obtained by cutting the block 10 along the second grooves 1b, and thus the semiconductor devices each having a configuration in which the lower shield plate 3 and the upper shield plate 7 are coupled by the side shield member 8 are produced.

Note that the insulating resin 9' is integral with an insulating resin 9. Accordingly, after formation of the second grooves 1b, the side shield members 8 make contact with the lower shield plates 3 and the upper shield plates 7 due to internal stress of the insulating resin 9'. In view of this, it is possible that the width of the insulating resin 9' in the first direction be set large enough to secure the stress.

[Semiconductor Device According to Fourth Embodiment]

Figure 31:
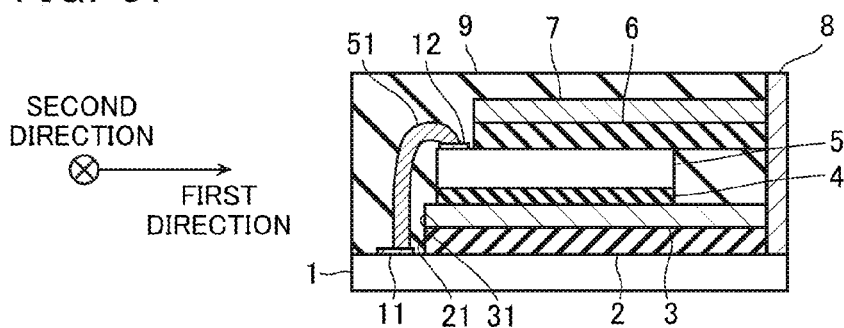
FIG. 31 is a side view schematically illustrating a semiconductor device according to fourth embodiment.

Next, a configuration of a semiconductor device according to fourth embodiment is described. FIG. 31 is a schematic cross-sectional view for explaining a configuration of a semiconductor device according to the present embodiment. The semiconductor device according to fourth embodiment has a configuration that is basically similar to the semiconductor device according to first embodiment. However, the semiconductor device according to the present embodiment is different from the semiconductor device according to first embodiment in that holes 21 and 31 are punched in portions of a first adhesive 2 and a lower shield plate 3, contact portions 11 are further formed in portions of a substrate 1 that are exposed in the holes, and bonding wires 51 are also drawn out from a semiconductor chip 5 in the first direction and connected to the contact portions 11 through the holes punched in the first adhesive 2 and the lower shield plate 3. In the semiconductor device according to the present embodiment, even if the number of bonding wires 51 drawn out from the semiconductor chip 5 increases to a certain number or more, contact can be easily made. Although the holes 21 and 31 are provided in the portions of the first adhesive 2 and the lower shield plate 3 in the present embodiment, holes may also be punched in a third adhesive 6 and an upper shield plate 7.

Next, a method for producing the semiconductor device according to fourth embodiment is described. FIGS. 32, 34, 36, 38, 40, and 42 are schematic plan views for explaining the method for producing the semiconductor device according to the present embodiment, and FIGS. 33, 35, 37, 39, 41, and 43 are cross-sectional views for explaining the method for producing the semiconductor device according to the present embodiment.

Figure 32:
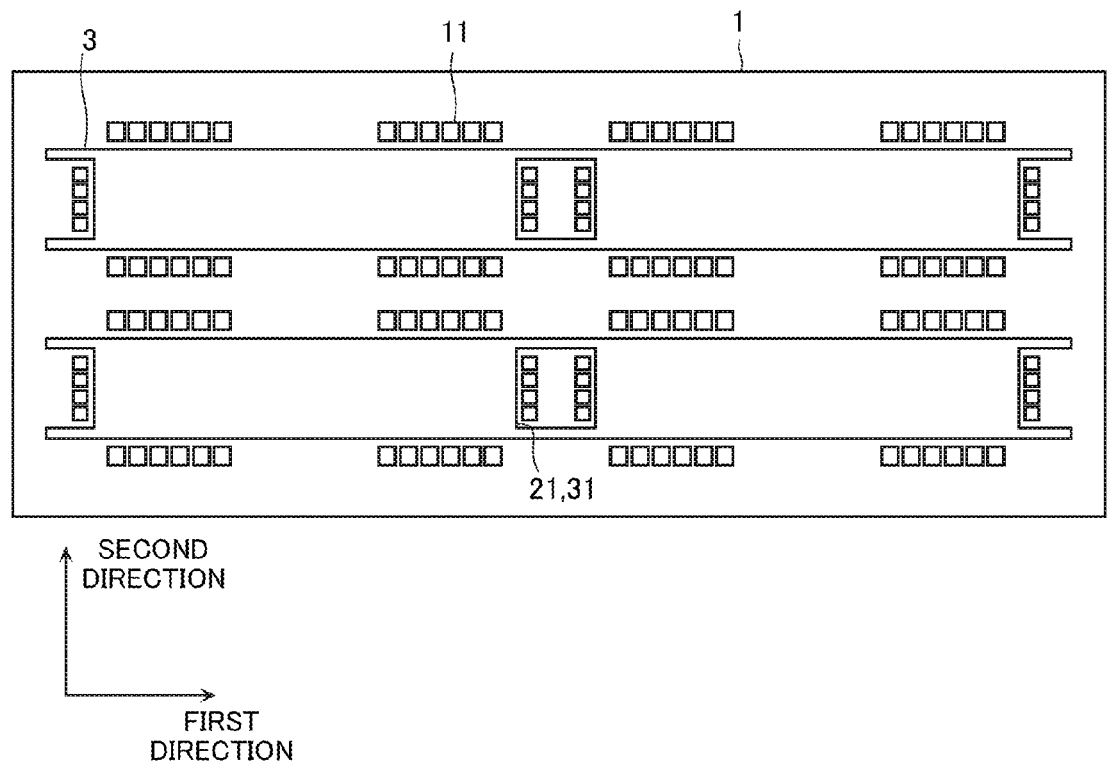
FIG. 32 is a plan view schematically illustrating a method for producing the semiconductor device.
Figure 33:
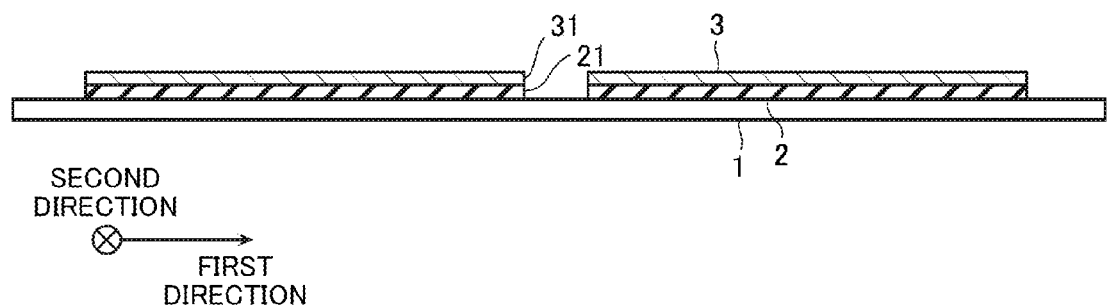
FIG. 33 is a side view schematically illustrating a method for producing the semiconductor device.

The method for producing the semiconductor device according to the present embodiment is almost the same as the method for producing the semiconductor device according to first embodiment. However, the method for producing the semiconductor device according to the present embodiment is different from the method for producing the semiconductor device according to first embodiment in that the holes 21 and 31 are formed in each of the lower shield plates 3 at predetermined intervals in the first direction; the contact portions 11 are formed on portions of the substrate 1 that correspond to the holes 21 and 31; and the first adhesive 2 is applied onto a rear surface of each of the lower shield plates 3, the holes 21 and 31 are formed in the first adhesive 2 and the lower shield plate 3, and then the first adhesive 2 and the lower shield plate 3 in which the holes 21 and 31 are formed are placed onto the substrate 1, as illustrated in FIGS. 32 and 33. Note that, for example, the lower shield plates 3 in which the holes 31 are formed may be placed after the first adhesive 2 is applied onto the substrate 1 so that the holes 21 are formed.

Figure 34:
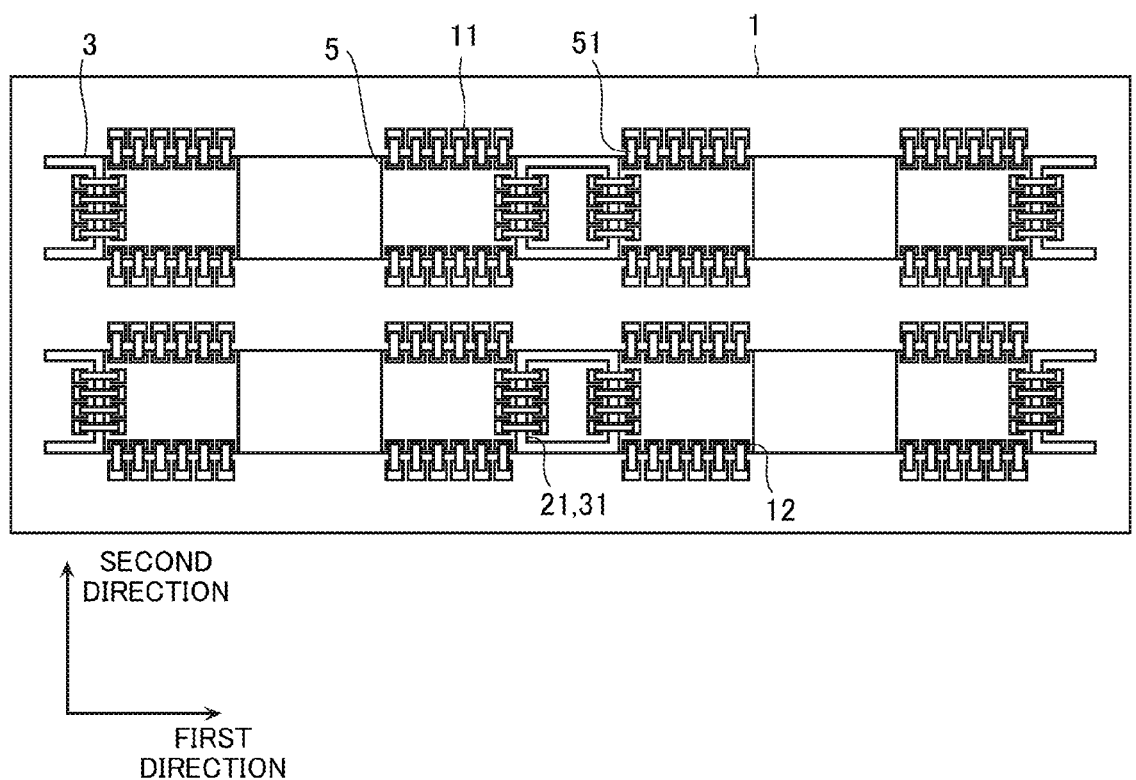
FIG. 34 is a plan view schematically illustrating a method for producing the semiconductor device.
Figure 35:
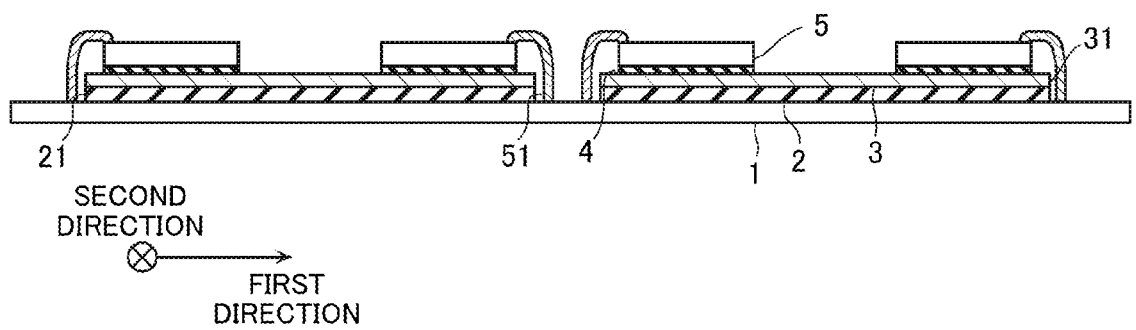
FIG. 35 is a side view schematically illustrating a method for producing the semiconductor device.

Next, as illustrated in FIGS. 34 and 35, the semiconductor chips 5 are mounted on the lower shield plates 3 as in first embodiment. Next, contact portions 12 of the semiconductor chips 5 and the contact portions 11 of the substrate 1 are electrically connected to each other via the bonding wires 51. Note that in the present embodiment, the contact portions 12 are also formed in portions in the vicinity of the holes 21 and 31 on the upper surface of each of the semiconductor chips 5.

Figure 36:
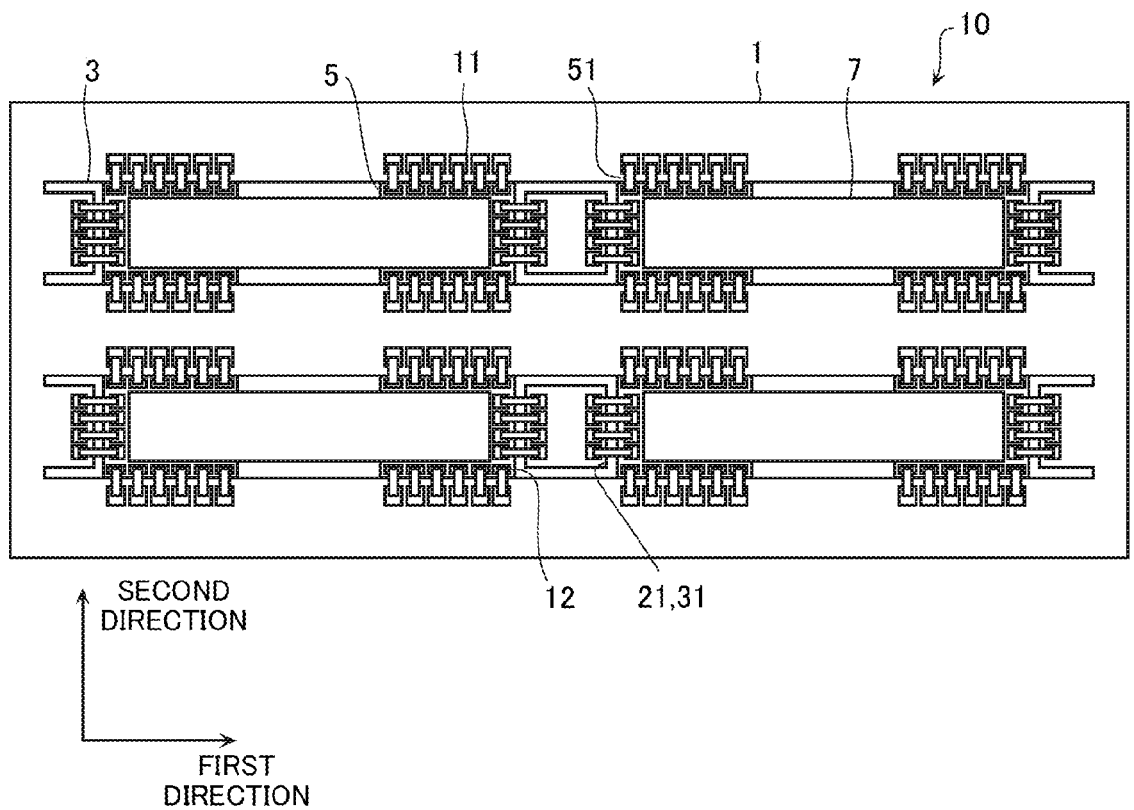
FIG. 36 is a plan view schematically illustrating a method for producing the semiconductor device.
Figure 37:
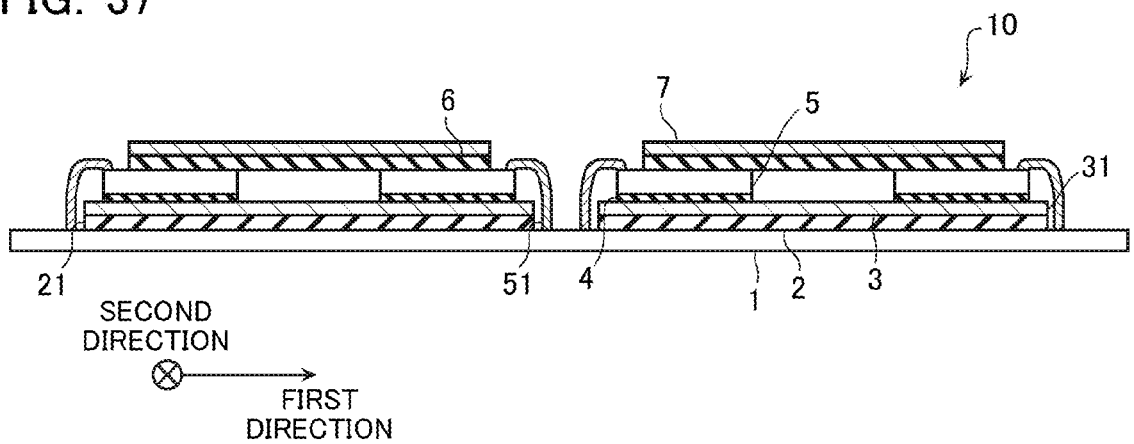
FIG. 37 is a side view schematically illustrating a method for producing the semiconductor device.

Next, as illustrated in FIGS. 36 and 37, the upper shield plates 7 extending in the first direction are attached onto the semiconductor chips 5 by using the third adhesive 6. This step is basically similar to the step described with reference to FIGS. 7 and 8, but in the present embodiment, the upper shield plates 7 are formed so as to avoid the bonding wires 51 connected to the contact portions 11 provided within the ranges of the holes 21 and 31. In the present embodiment, this configuration is realized by attaching a plurality of upper shield plates 7, but may be realized, for example, by punching holes in the third adhesive 6 and the upper shield plate 7.

Figure 38:
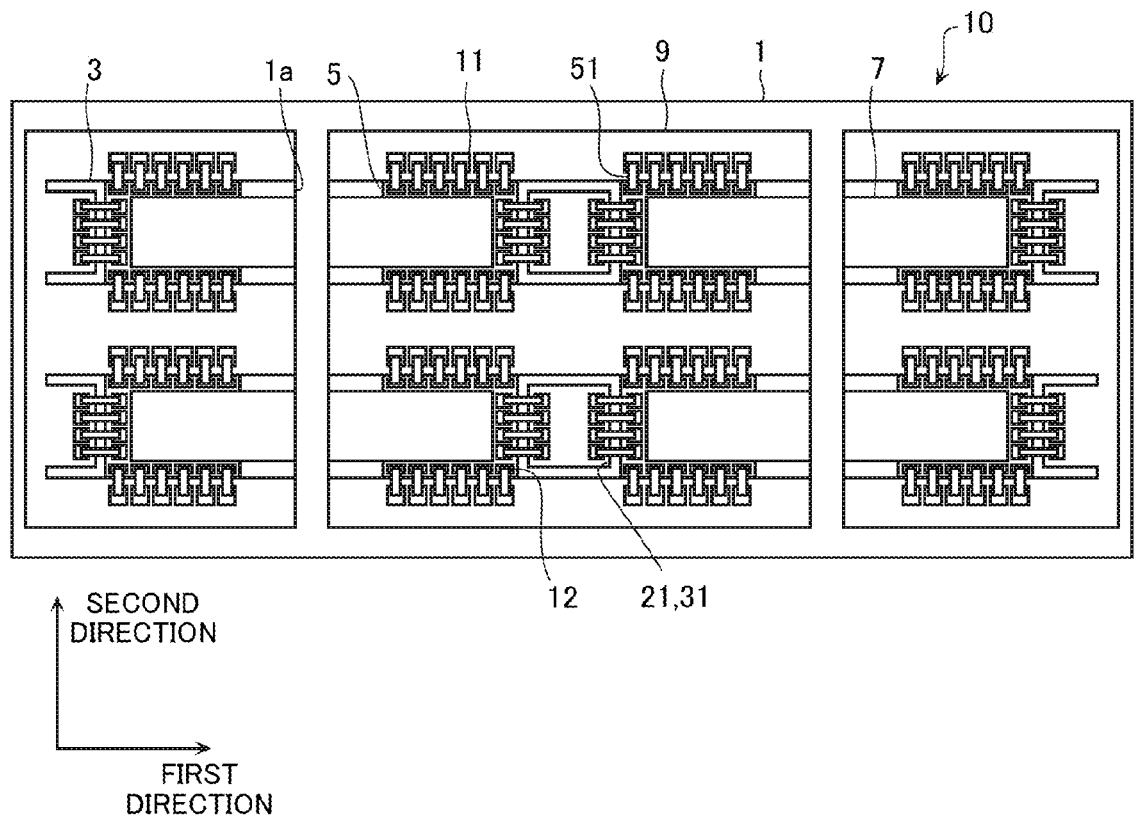
FIG. 38 is a plan view schematically illustrating a method for producing the semiconductor device.
Figure 39:
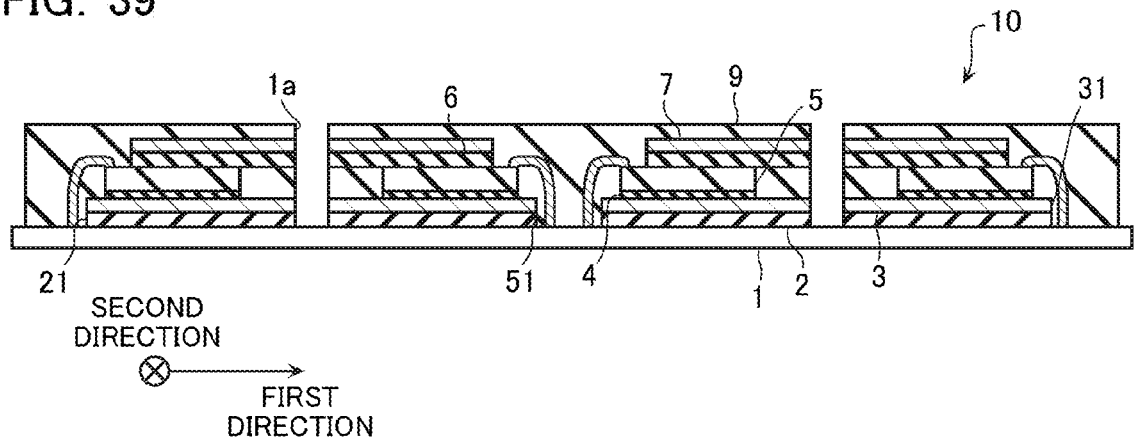
FIG. 39 is a side view schematically illustrating a method for producing the semiconductor device.

Next, as illustrated in FIGS. 38 and 39, the lower shield plates 3, the semiconductor chips 5, and the upper shield plates 7 on the substrate 1 are embedded in the insulating resin 9, so that a block 10 is formed. Subsequently, first grooves 1a extending in the second direction are formed in the block 10. The first grooves 1a are provided on a side of the semiconductor chips 5 on which the bonding wires 51 are not connected. Note that in the present embodiment, the first grooves 1a are formed in the same manner as first embodiment, but may be formed in the same manner as third embodiment.

Figure 40:
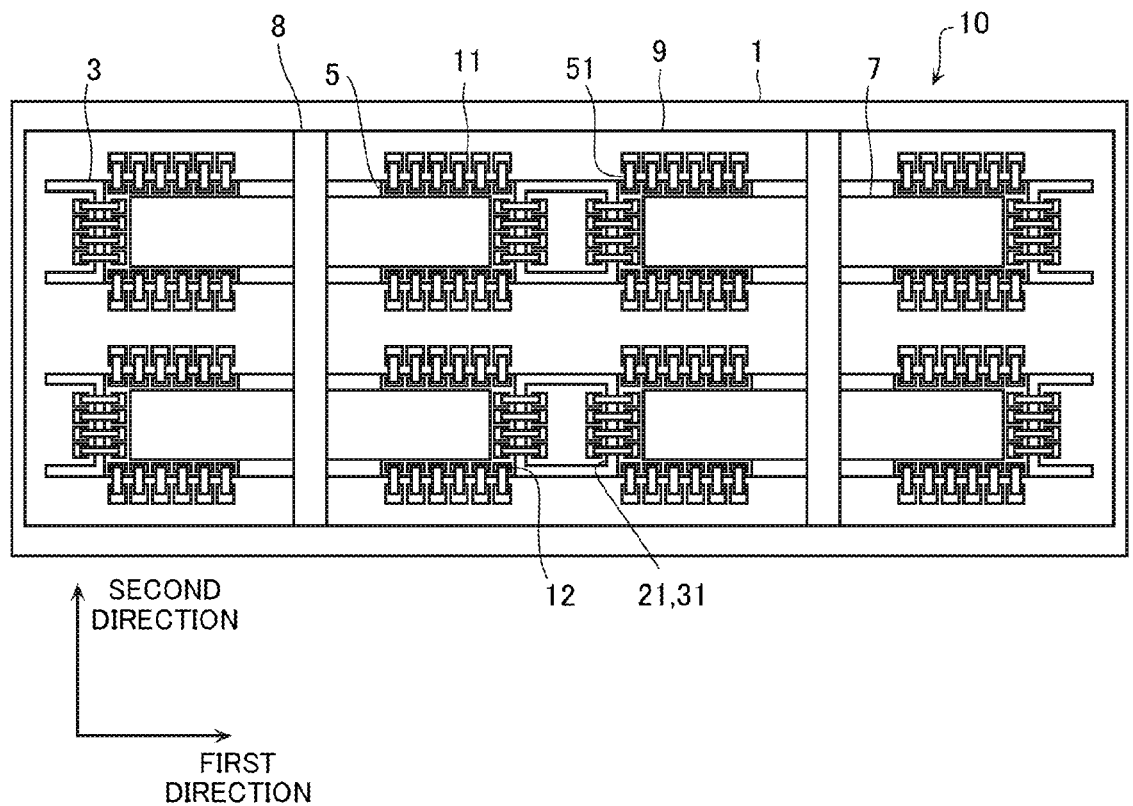
FIG. 40 is a plan view schematically illustrating a method for producing the semiconductor device.
Figure 41:
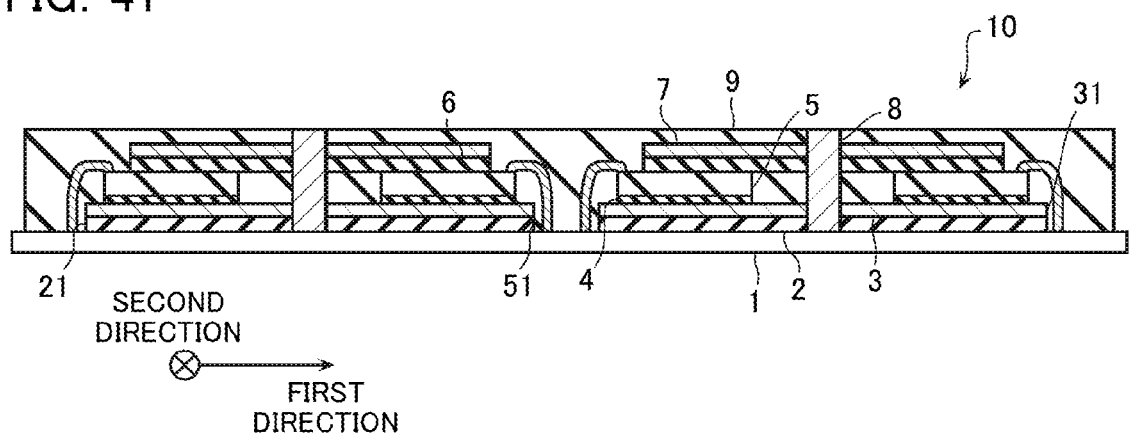
FIG. 41 is a side view schematically illustrating a method for producing the semiconductor device.

Next, as illustrated in FIGS. 40 and 41, the side shield members 8 are formed in the first grooves 1a. The side shield members 8 can be formed in the same manner as first embodiment or third embodiment.

Figure 42:
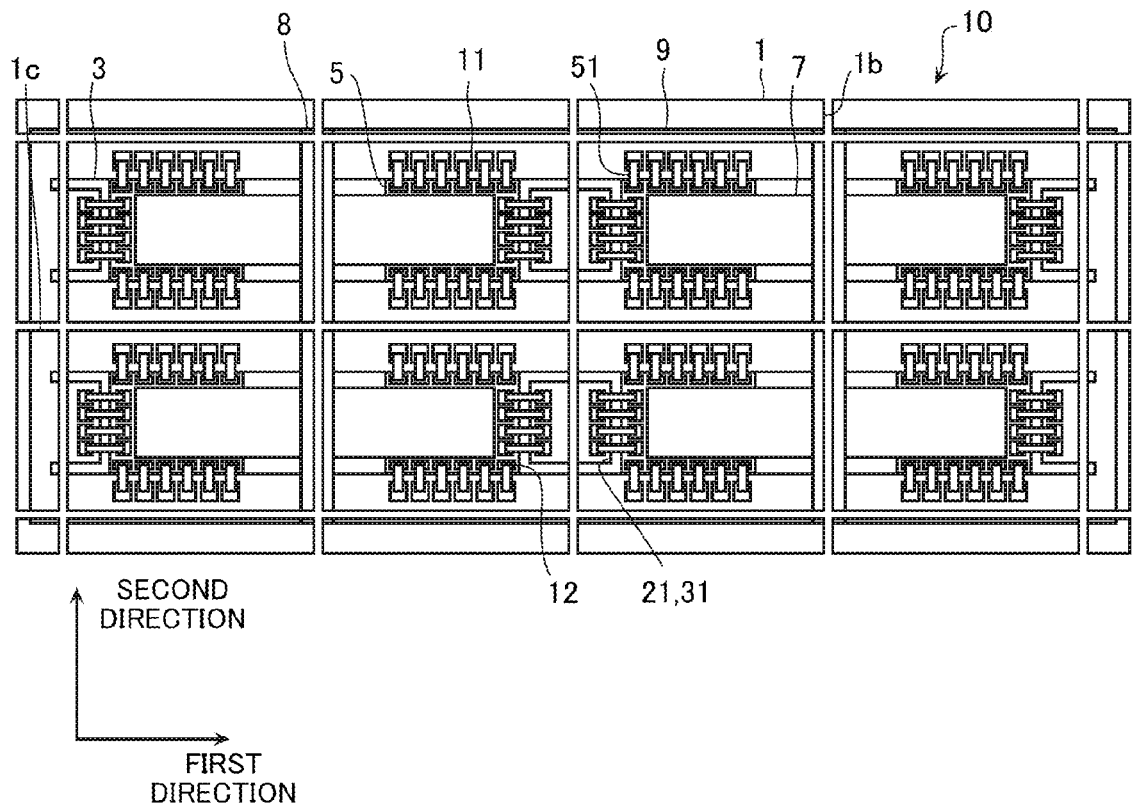
FIG. 42 is a plan view schematically illustrating a method for producing the semiconductor device.
Figure 43:
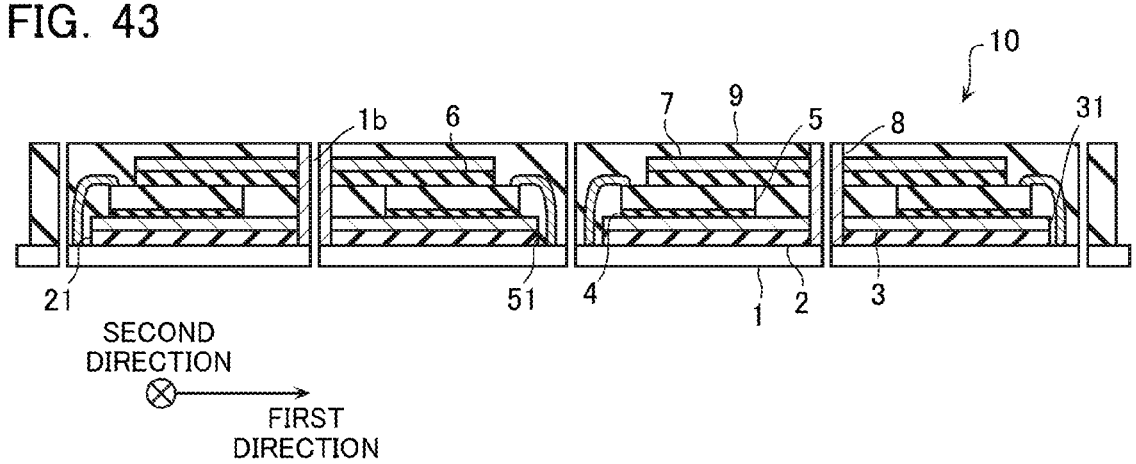
FIG. 43 is a side view schematically illustrating a method for producing the semiconductor device.

Next, as illustrated in FIGS. 42 and 43, second grooves 1b extending in the second direction and third grooves 1c extending in the first direction are formed between the semiconductor chips 5, so that individual semiconductor devices are obtained. The width of each of the second grooves 1b is smaller than that of each of the first grooves 1a. The side shield member 8 remains in each of the semiconductor devices obtained by cutting the block 10 along the second grooves 1b, and thus the semiconductor devices each having a configuration in which the lower shield plate 3 and the upper shield plate 7 are coupled by the side shield member 8 are produced.

The second grooves 1b pass between the contact portions 11 formed in the holes 21 and 31. Accordingly, the second grooves 1b do not cut the bonding wires 51. In other words, the contact portions 11 formed in the holes 21 and 31 are disposed away from each other so that the bonding wires 51 are not cut by the second grooves 1b.

[Semiconductor Device According to Another Embodiment]

Figure 44:
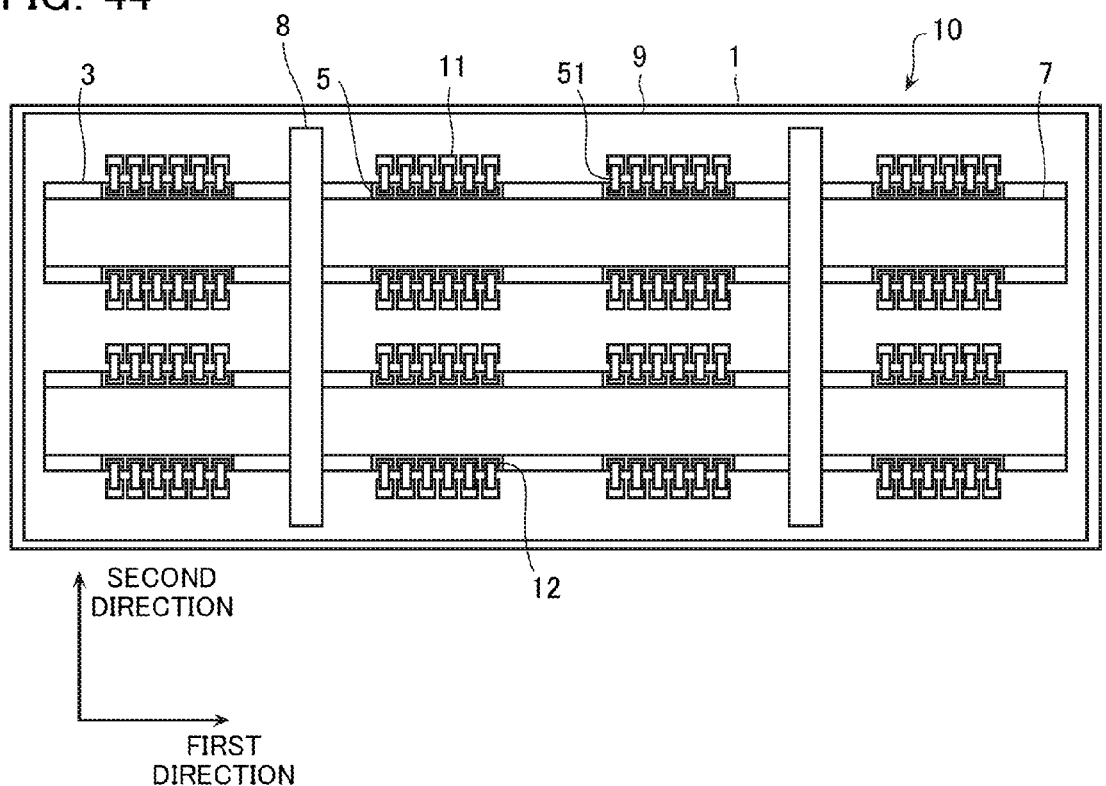
FIG. 44 is a plan view schematically illustrating a method for producing a semiconductor device according to another embodiment.
Figure 45:
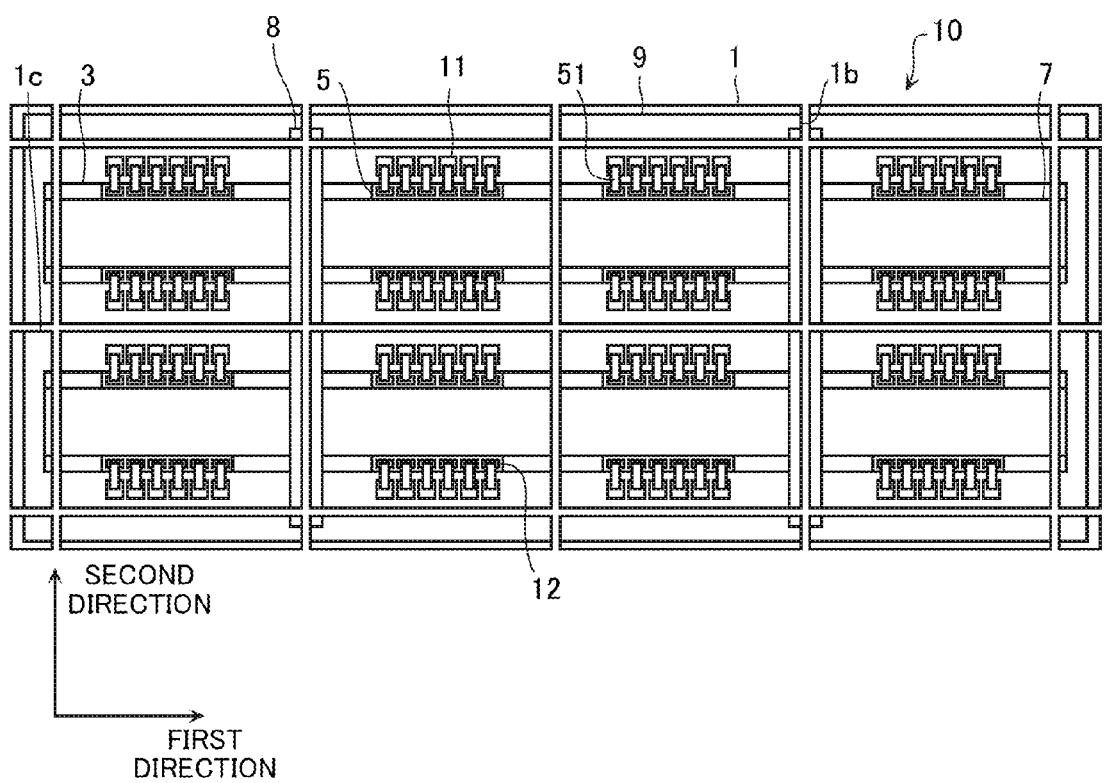
FIG. 45 is a plan view schematically illustrating a method for producing the semiconductor device.

In first through fourth embodiments, the insulating resin 9 is divided in the first direction by the first grooves 1a extending in the second direction. However, as illustrated in FIG. 44, the first grooves 1a may be formed as closed holes (recesses) extending in the second direction. In this case, it is possible that the width of the insulating resin 9 and the width of the first grooves 1a be adjusted so that the start and end points of the first grooves 1a do not appear in the semiconductor devices in a case where the individual semiconductor devices are separated by the second grooves 1b and the third grooves 1c as illustrated in FIG. 45.

Some embodiments of the present invention have been described above, but these embodiments are examples and do not limit the scope of the present invention. These embodiments can be carried out in other various forms, and various kinds of omission, substitution, change can be made without departing from the scope of the invention. These embodiments and modifications thereof are included in the scope of the invention and included in the scope of the invention described in the claims and equivalents thereof.

REFERENCE SIGNS LIST

1 . . . substrate, 2 . . . first adhesive, 3 . . . lower shield plate, 4 . . . second adhesive, 5 . . . semiconductor chip, 6 . . . third adhesive, 7 . . . upper shield plate, 8 . . . side shield member, 10 . . . block, 11,12 . . . contact portion, 51 . . . bonding wire

The invention claimed is:

1. A method for producing a semiconductor device, comprising:
   providing, above a substrate on which a first contact portion is formed, a lower shield plate that extends in a first direction and includes a magnetic substance so that the lower shield plate avoids the first contact portion;
   placing, above the lower shield plate, a plurality of semiconductor chips each having a second contact portion at predetermined intervals in the first direction so that the first contact portion and the second contact portion correspond to each other;
   electrically connecting the first contact portion and the second contact portion by using a connection member;
   placing, above the semiconductor chips, an upper shield plate that extends in the first direction and includes a magnetic substance so that the upper shield plate avoids the second contact portion and the connection member;
   forming a block by sealing the lower shield plate, the semiconductor chips, the connection member, and the upper shield plate by using a resin;
   cutting the lower shield plate and the upper shield plate by forming, in the block, a first groove extending in a second direction intersecting with the first direction so that the first groove avoids the semiconductor chips;
   forming, in the first groove, a side shield member that connects the lower shield plate and the upper shield plate and includes a magnetic substance; and
   separating the semiconductor chips by cutting the block so that the side shield member is separated in the first direction.

2. The method according to claim 1, wherein the side shield member is formed by filling the first groove with a resin containing a magnetic substance.

3. The method according to claim 1, wherein the side shield member is formed by plating the first groove with a magnetic substance.

4. The method according to claim 1, wherein the side shield member is formed by placing a pair of plate-like members including a magnetic substance in the second groove and then filling a space between the plate-like members with a resin.

* * * * *